(12) United States Patent
Wakahara et al.

(10) Patent No.: US 10,991,623 B2
(45) Date of Patent: Apr. 27, 2021

(54) WAFER PROCESSING METHOD

(71) Applicant: DISCO CORPORATION, Tokyo (JP)

(72) Inventors: Masatoshi Wakahara, Tokyo (JP);
Karl Heinz Priewasser, Munich (DE);
Meiya Piao, Tokyo (JP); Kentaro Odanaka, Tokyo (JP); Wakana Onoe, Tokyo (JP); Heidi Lan, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/709,452

(22) Filed: Dec. 10, 2019

(65) Prior Publication Data

US 2020/0185227 A1 Jun. 11, 2020

(30) Foreign Application Priority Data

Dec. 11, 2018 (JP) .............................. JP2018-232029

(51) Int. Cl.
| | | |
|---|---|---|
| *H01L 21/78* | (2006.01) | |
| *H01L 21/308* | (2006.01) | |
| *H01L 21/3065* | (2006.01) | |
| *H01L 21/683* | (2006.01) | |
| *B23K 26/364* | (2014.01) | |

(52) U.S. Cl.
CPC ............ *H01L 21/78* (2013.01); *B23K 26/364* (2015.10); *H01L 21/308* (2013.01); *H01L 21/30655* (2013.01); *H01L 21/6836* (2013.01)

(58) Field of Classification Search
CPC .. H01L 21/78; H01L 21/3043; H01L 21/6715
See application file for complete search history.

(56) References Cited

U.S. PATENT DOCUMENTS

| 6,573,156 B1 * | 6/2003 | Wang ................. B81C 1/00873 257/E21.599 |
|---|---|---|
| 2005/0186760 A1 * | 8/2005 | Hashimura ............ B23K 26/18 438/460 |
| 2018/0019139 A1 * | 1/2018 | Sun ........................ B05D 1/005 |
| 2019/0279902 A1 * | 9/2019 | Park .................... H01L 21/2633 |

FOREIGN PATENT DOCUMENTS

JP 2006114825 A 4/2006

* cited by examiner

*Primary Examiner* — Thomas T Pham
(74) *Attorney, Agent, or Firm* — Greer Burns & Crain Ltd.

(57) ABSTRACT

A wafer processing method for processing a wafer having a substrate and a device layer formed on a front side of the substrate includes forming a mask on a back side of the wafer, so as to form an etched groove along each street through a thickness of the substrate from the back side of the wafer, performing plasma etching from the back side of the wafer through the mask to the substrate after forming the mask, thereby forming the etched groove in the substrate along each street so that the etched groove has a depth equal to the thickness of the substrate, and applying a laser beam to the device layer along each street from the front side of the wafer before etching and mask forming, thereby forming a device layer dividing groove corresponding to the etched groove along each street.

3 Claims, 15 Drawing Sheets

… (1)

WAFER PROCESSING METHOD

BACKGROUND OF THE INVENTION

Field of the Invention

The present invention relates to a wafer processing method for processing a wafer having a substrate and a device layer formed on a front side of the substrate, the device layer being partitioned by a plurality of crossing streets to thereby define a plurality of separate regions where a plurality of devices are respectively formed.

Description of the Related Art

In order to reduce the width of each street, thereby increasing the number of devices that can be obtained from a wafer or to reduce the time required for processing of the wafer, there has been proposed what is generally called plasma dicing for dividing the wafer into individual device chips by using plasma etching (see Japanese Patent Laid-open No. 2006-114825, for example).

SUMMARY OF THE INVENTION

However, the processing method described in Japanese Patent Laid-open No. 2006-114825 has the following problem. A wafer having devices formed on a front side has a device layer forming the devices. The device layer is composed of a circuit layer (metal layer) and an insulating layer. This device layer is also present on each street. Accordingly, when etching gas suitable for etching of silicon (substrate) is used, it is very difficult to etch the device layer present on each street.

Further, in the processing method described in Japanese Patent Laid-open No. 2006-114825, plasma etching is performed through a mask to the wafer from the front side thereof. Accordingly, if the thickness of the mask is not uniform, there is a possibility for the mask to be partially removed in a thin area of the mask during plasma etching, so that the front side of the wafer is exposed to cause damage to the devices.

It is therefore an object of the present invention to provide a wafer processing method which can divide a wafer into individual device chips while suppressing damage to the devices.

In accordance with an aspect of the present invention, there is provided a wafer processing method for processing a wafer having a substrate and a device layer formed on a front side of the substrate, the device layer being partitioned by a plurality of crossing streets to thereby define a plurality of separate regions where a plurality of devices are respectively formed, the wafer processing method comprising a mask forming step of forming a mask on a back side of the wafer, so as to form an etched groove along each street through a thickness of the substrate from the back side of the wafer; a plasma etching step of performing plasma etching from the back side of the wafer through the mask to the substrate after performing the mask forming step, thereby forming the etched groove in the substrate along each street so that the etched groove has a depth equal to the thickness of the substrate; and a device layer dividing step of applying a laser beam to the device layer along each street from a front side of the wafer before performing the plasma etching step and the mask forming step, thereby forming a device layer dividing groove corresponding to the etched groove along each street.

Preferably, a width of the etched groove on the front side of the substrate is larger than a width of the device layer dividing groove on a lower surface of the device layer.

Preferably, the device layer dividing groove comprises two dividing grooves extending along each street so as to be formed at opposite ends along the width of the etched groove on the front side of the substrate.

Preferably, the wafer processing method further comprises a protective member providing step of providing a protective member on the front side of the wafer so as to cover the device layer after performing the device layer dividing step; and a transfer step of providing a support member on the back side of the wafer and removing the protective member from the front side of the wafer, after performing the plasma etching step.

The wafer processing method of the present invention has an effect that the wafer can be divided into individual device chips while suppressing damage to the devices.

The above and other objects, features, and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENTS

Preferred embodiments of the present invention will now be described in detail with reference to the drawings. The present invention is not limited to the preferred embodiments. In addition, the components used in the preferred embodiments may include those that can be easily assumed by persons skilled in the art or substantially the same elements as those known in the art. Moreover, the configurations described below may suitably be combined. Further, the configurations may be variously omitted, replaced, or changed without departing from the scope of the present invention.

First Preferred Embodiment

Figure 1:
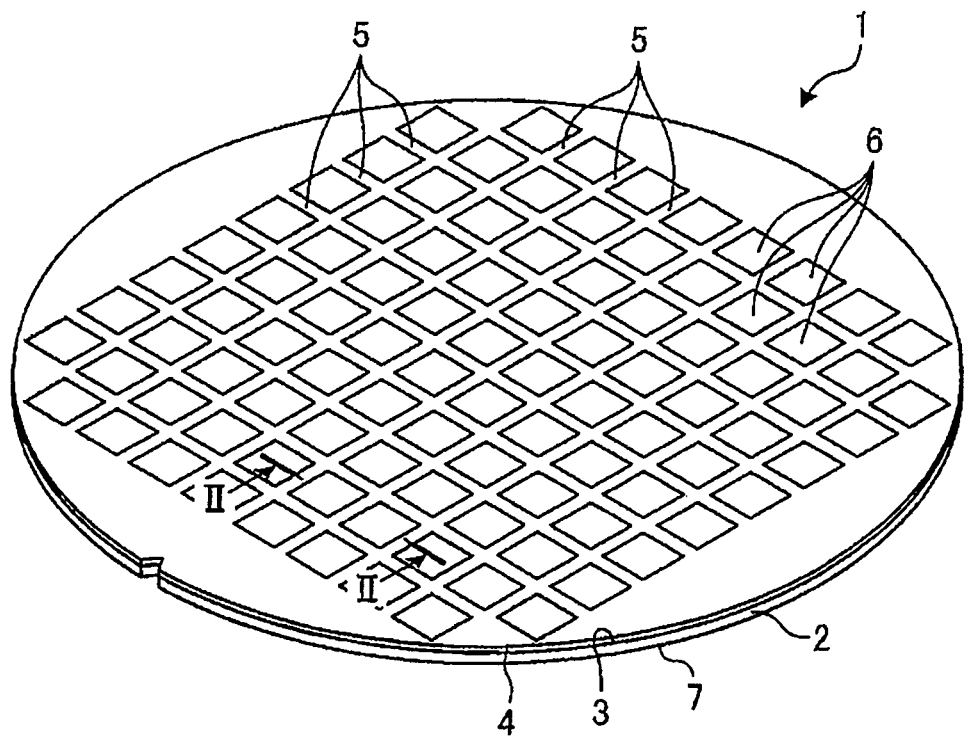
FIG. 1 is a perspective view depicting a wafer as a workpiece to be processed by a wafer processing method according to a first preferred embodiment of the present invention.
Figure 2:
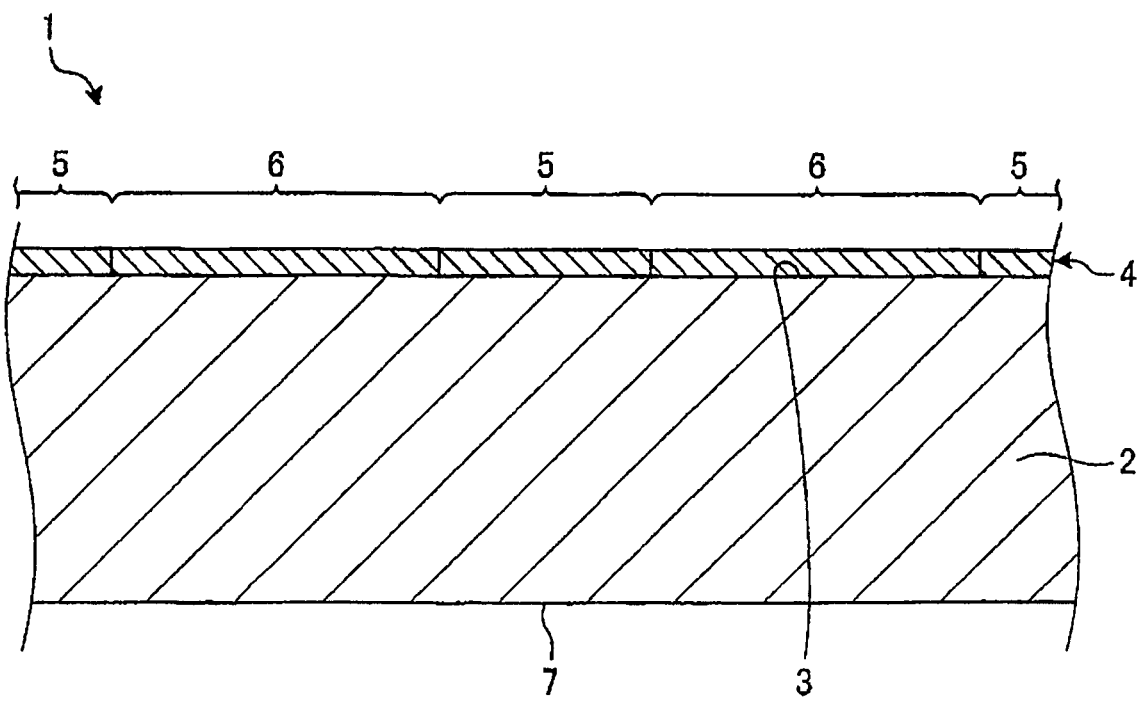
FIG. 2 is a sectional view of an essential part of the wafer, taken along the line II-II in FIG. 1.
Figure 3:
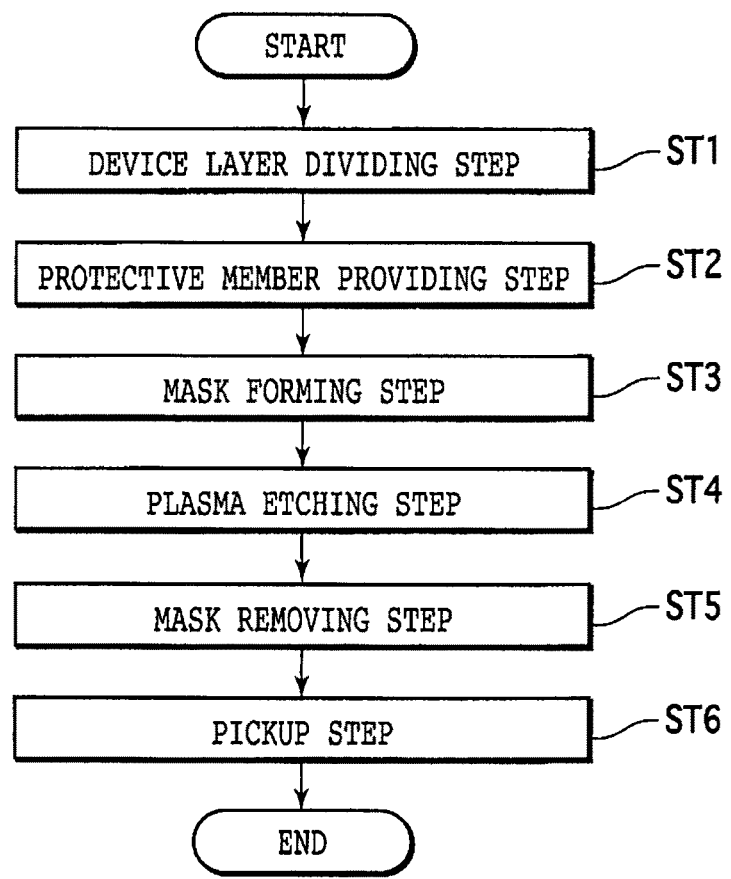
FIG. 3 is a flowchart depicting the flow of the wafer processing method according to the first preferred embodiment.

A wafer processing method according to a first preferred embodiment of the present invention will now be described with reference to the drawings. FIG. 1 is a perspective view depicting a wafer 1 as a workpiece to be processed by the wafer processing method according to the first preferred embodiment. FIG. 2 is a sectional view of an essential part of the wafer 1, taken along the line II-II in FIG. 1. FIG. 3 is a flowchart depicting the flow of the wafer processing method according to the first preferred embodiment.

The wafer processing method according to the first preferred embodiment is a processing method for the wafer 1 depicted in FIG. 1. The wafer 1 is a disk-shaped semiconductor wafer or an optical device wafer having a substrate 2 formed of silicon, sapphire, or gallium arsenide, for example. As depicted in FIGS. 1 and 2, the wafer 1 includes the substrate 2 having a front side 3, and a device layer 4 formed on the front side 3 of the substrate 2. Further, a plurality of crossing streets 5 are formed on the front side 3 of the substrate 2 to define a plurality of separate regions where a plurality of devices 6 are respectively formed. In the first preferred embodiment, the plural crossing streets 5 intersect at right angles. The substrate 2 has a back side 7 opposite to the front side 3. In other words, the back side 7 of the substrate 2 is the back side of the wafer 1.

Each device 6 is an integrated circuit (IC) or large scale integration (LSI), for example. The device layer 4 forms the plural devices 6. The device layer 4 includes a plurality of circuit layers of metal forming the circuits in each device 6 and a plurality of insulating layers formed from low-permittivity insulating films (which will hereinafter be referred to as low-k films), in which these plural circuit layers and these plural insulating layers are alternately stacked. In other words, each device 6 is formed by alternately stacking the plural circuit layers of metal forming the circuits and the plural insulating layers of low-k films supporting the circuit layers. Each insulating layer of low-k film is an interlayer insulating film.

The wafer processing method according to the first preferred embodiment is a method for dividing the wafer 1 along the plural streets 5 to obtain individual device chips respectively including the plural devices 6. As depicted in FIG. 3, the wafer processing method according to the first preferred embodiment includes a device layer dividing step ST1, a protective member providing step ST2, a mask forming step ST3, a plasma etching step ST4, a mask removing step ST5, and a pickup step ST6.

(Device Layer Dividing Step)

Figure 4:
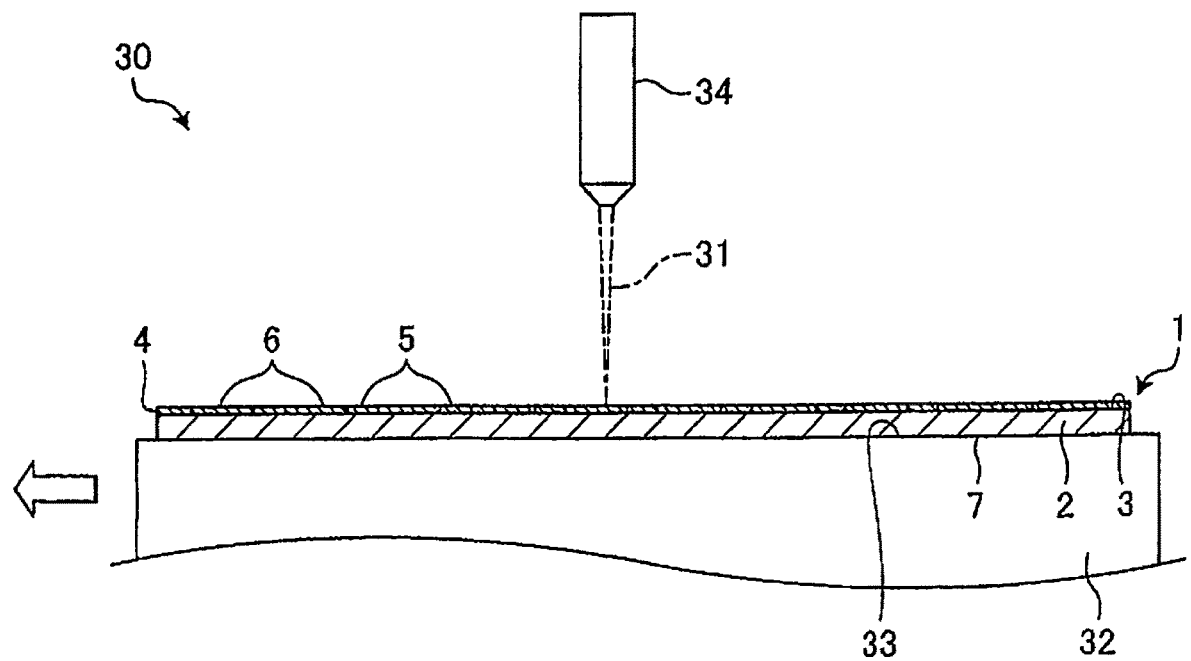
FIG. 4 is a partially sectional side view schematically depicting a device layer dividing step included in the wafer processing method depicted in FIG. 3.
Figure 5:
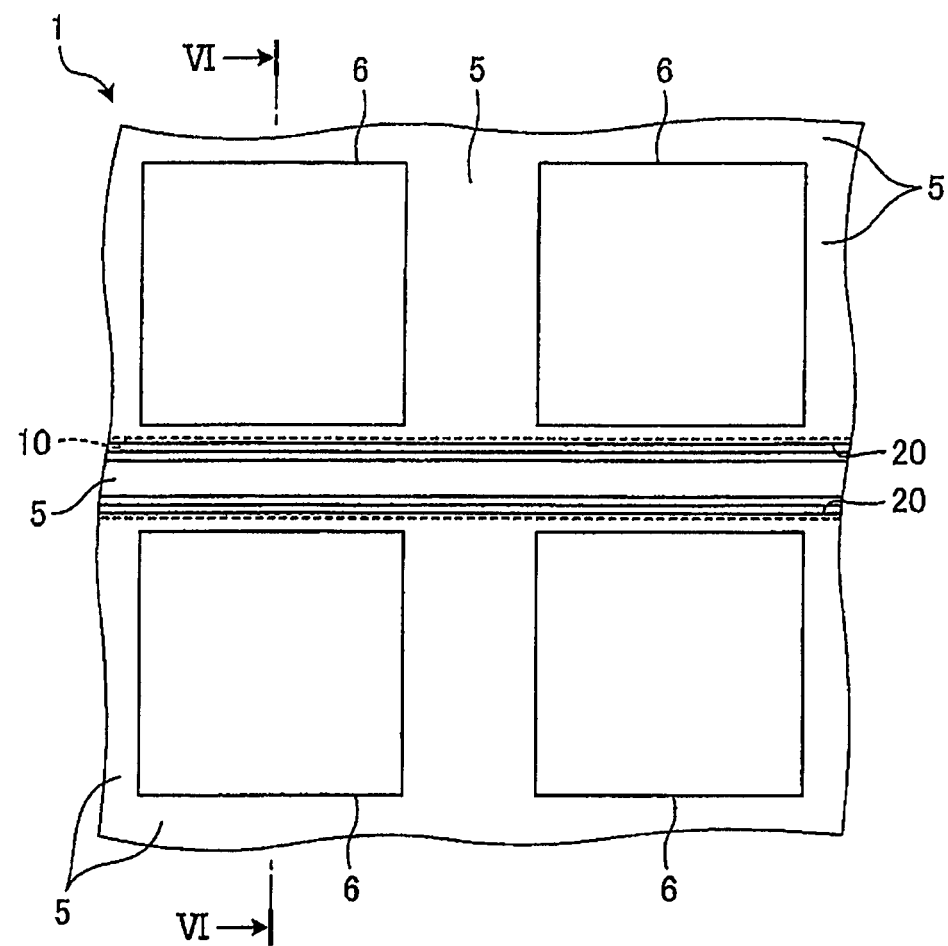
FIG. 5 is a plan view depicting an essential part of the wafer in a condition where the device layer dividing step is finished.
Figure 6:
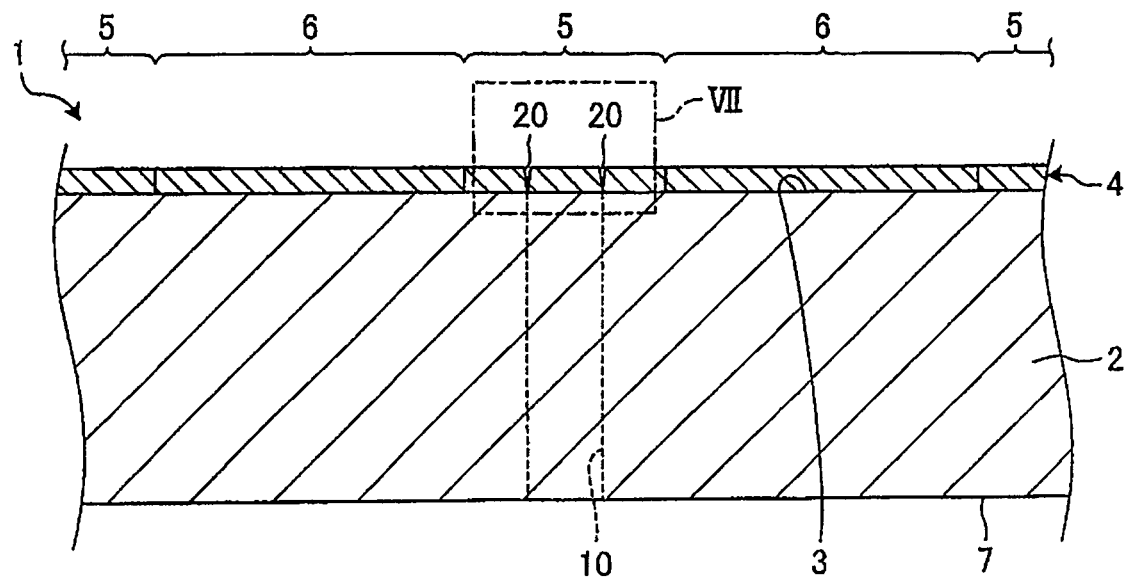
FIG. 6 is a sectional view taken along the line VI-VI in FIG. 5.
Figure 7:
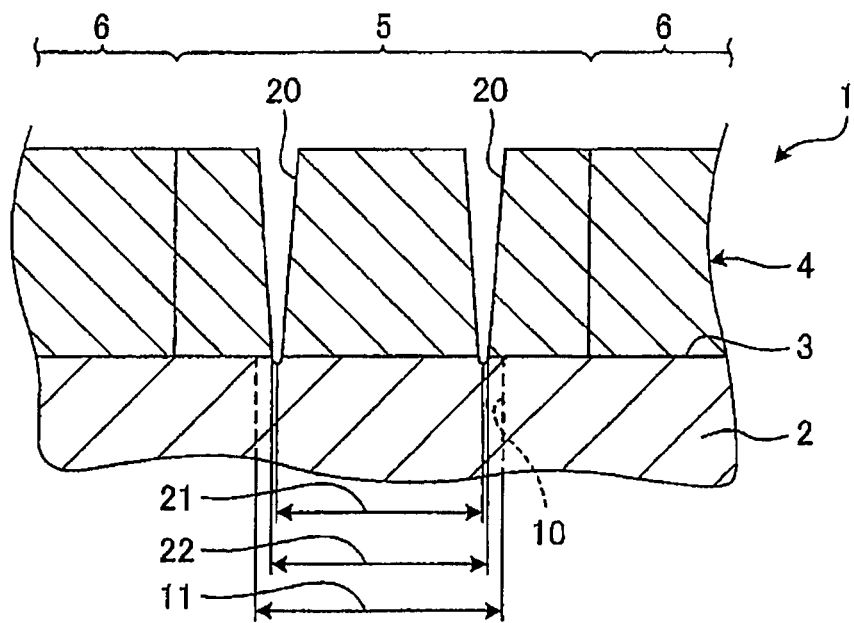
FIG. 7 is an enlarged view of a box part VII in FIG. 6.

FIG. 4 is a partially sectional side view schematically depicting the device layer dividing step ST1 of the wafer processing method depicted in FIG. 3. FIG. 5 is a plan view depicting an essential part of the wafer 1 in the condition where the device layer dividing step ST1 of the wafer processing method depicted in FIG. 3 is finished. FIG. 6 is a sectional view taken along the line VI-VI in FIG. 5. FIG. 7 is an enlarged view of a box part VII in FIG. 6.

The device layer dividing step ST1 is a step of applying a laser beam 31 (see FIG. 4) to the device layer 4 along each street 5 from the front side 3 of the substrate 2 of the wafer 1 before performing the plasma etching step ST4 and the mask forming step ST3, thereby forming a device layer dividing groove 20 (see FIG. 5) corresponding to an etched groove 10 (see FIG. 5) to be formed in the plasma etching step ST4. The device layer dividing step ST1 is performed by using a laser processing apparatus 30 depicted in FIG. 4. The laser processing apparatus 30 includes a chuck table 32 having a holding surface 33 and a laser beam applying unit 34 for applying the laser beam 31. In the device layer dividing step ST1, the back side 7 of the substrate 2 of the wafer 1 is held under suction on the holding surface 33 of the chuck table 32. Thereafter, an imaging unit (not depicted) is used to image the wafer 1 held on the chuck table 32. According to an image obtained by the imaging unit, alignment is performed to adjust the positional relation between the wafer 1 and the laser beam applying unit 34.

Thereafter, the chuck table 32 and the laser beam applying unit 34 are relatively moved in a horizontal direction along each street 5. At the same time, the laser beam 31 having an absorption wavelength to the wafer 1 is applied from the laser beam applying unit 34 to each street 5 as depicted in FIG. 4. In the first preferred embodiment, the laser beam 31 is applied to the lateral end portions of each street 5 to thereby form a pair of device layer dividing grooves 20 along each street 5. This operation is similarly performed along all of the streets 5 to form a plurality of device layer dividing grooves 20 along all of the streets 5. That is, each device layer dividing groove 20 is formed by performing ablation of the device layer 4 along each street 5.

As depicted in FIGS. 5, 6, and 7, at least the device layer 4 is removed at the lateral end portions of each street 5 by applying the laser beam 31, thereby forming the pair of device layer dividing grooves 20 along each street 5 so that the substrate 2 is exposed to the pair of device layer dividing grooves 20 at the lateral end portions of each street 5. Thus, two device layer dividing grooves 20 parallel to each other are formed along each street 5 so as to divide the device layer 4. As depicted in FIG. 7, the two device layer dividing grooves 20 along each street 5 are two dividing grooves for dividing the device layer 4 at the opposite ends along width 11 of the etched groove 10 on the front side 3 of the substrate 2.

Each device layer dividing groove 20 extends linearly in a longitudinal direction of each street 5. In the first preferred embodiment, a part of the substrate 2 is also removed by each device layer dividing groove 20. The two device layer dividing grooves 20 along each street 5 are formed at two positions equally spaced from the center of each street 5 in its lateral direction. In FIG. 7, reference numeral 21 denotes the distance between the bottoms of the two device layer dividing grooves 20 along each street 5. This distance 21 is equal to the distance between the focal points of the laser beams 31 applied to form the two device layer dividing grooves 20 along each street 5. This distance 21 is smaller than the width 11 of the etched groove 10 on the front side 3 of the substrate 2. Further, reference numeral 22 denotes the distance between the outer edges of the two device layer dividing grooves 20 along each street 5 on the lower surface (back side) of the device layer 4. The width 11 of the etched groove 10 on the front side 3 of the substrate 2 is larger than the distance 22. In the first preferred embodiment, the distance 22 between the outer edges of the two device layer dividing grooves 20 along each street 5 on the lower surface of the device layer 4 corresponds to a width of a device layer dividing groove formed along each street on the lower surface of the device layer according to the present invention.

Further, the focal points of the laser beams 31 for forming the two device layer dividing grooves 20 along each street 5 are set so that the difference between the width 11 of the etched groove 10 on the front side 3 of the substrate 2 and the distance 22 between the outer edges of the two device layer dividing grooves 20 on the lower surface of the device layer 4 is greater than 0 μm but not greater than 30 μm.

In the first preferred embodiment, the device layer dividing step ST1 may be performed under the following conditions, for example. The wavelength of the laser beam 31 is 355 nm. The power of the laser beam 31 is 2.5 W. The repetition frequency of the laser beam 31 (pulsed laser beam) is 150 kHz. The relatively moving speed of the laser beam applying unit 34 and the wafer 1 is 400 mm/sec. After finishing the device layer dividing step ST1, the wafer processing method depicted in FIG. 3 proceeds to the protective member providing step ST2.

(Protective Member Providing Step)

Figure 8:
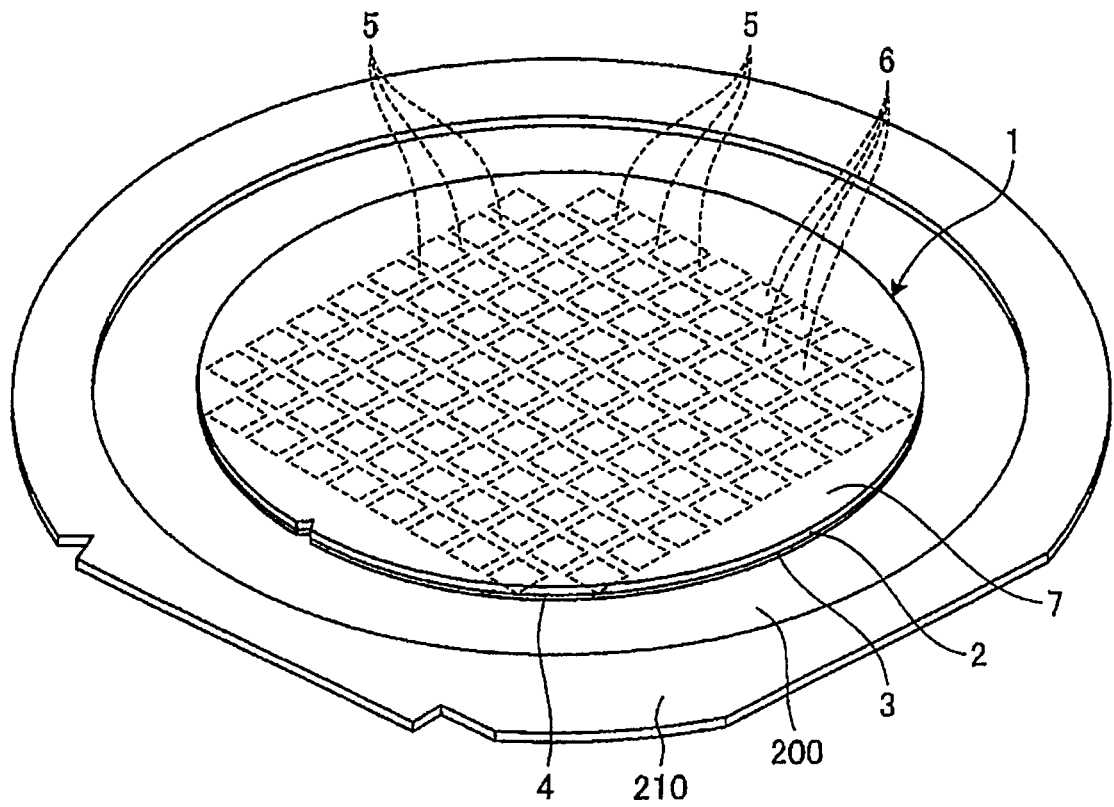
FIG. 8 is a perspective view of the wafer in a condition where a protective member providing step included in the wafer processing method depicted in FIG. 3 is finished.

FIG. 8 is a perspective view of the wafer 1 in the condition where the protective member providing step ST2 of the wafer processing method depicted in FIG. 3 is finished. The protective member providing step ST2 is a step of providing an adhesive tape 200 as a protective member on the front side 3 of the substrate 2 so as to cover the device layer 4 after performing the device layer dividing step ST1.

Figure 10:
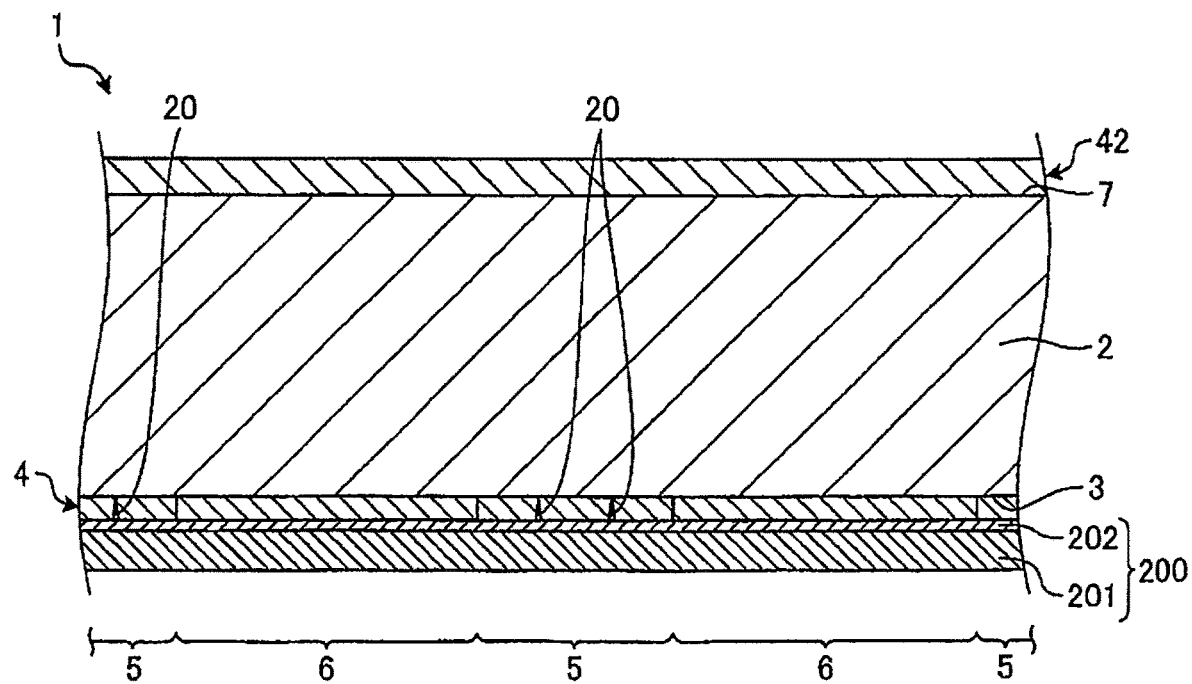
FIG. 10 is a sectional view of an essential part of the wafer in a condition where the water-soluble resin has been applied to the back side of the wafer in the mask forming step.

In the protective member providing step ST2, the adhesive tape 200 is a circular tape larger in diameter than the wafer 1. The adhesive tape 200 is attached to the device layer 4 formed on the front side 3 of the substrate 2 of the wafer 1 as depicted in FIG. 8. A central portion of the adhesive tape 200 is attached to the device layer 4. Further, a ring frame 210 is attached to a peripheral portion of the adhesive tape 200 as depicted in FIG. 8. As depicted in FIG. 10, the adhesive tape 200 is composed of a base layer 201 and an adhesive layer 202 formed on one side of the base layer 201. The base layer 201 is formed of an insulating synthetic resin. In FIG. 8, the device layer dividing grooves 200 are not depicted. While the adhesive tape 200 larger in diameter than the wafer 1 is used as a protective member in the first preferred embodiment, the protective member is not limited to the adhesive tape 200 in the present invention. For example, an adhesive tape having the same diameter as that of the wafer 1 may be used as the protective member, in which this adhesive tape is composed of the base layer 201 and the adhesive tape 202. Further, a disk-shaped hard plate having the same diameter as that of the wafer 1 may also be used as the protective member, in which this hard plate is formed of a hard material. In other words, the ring frame 210 may be omitted. After finishing the protective member providing step ST2, the wafer processing method depicted in FIG. 3 proceeds to the mark forming step ST3.

(Mask Forming Step)

Figure 9:
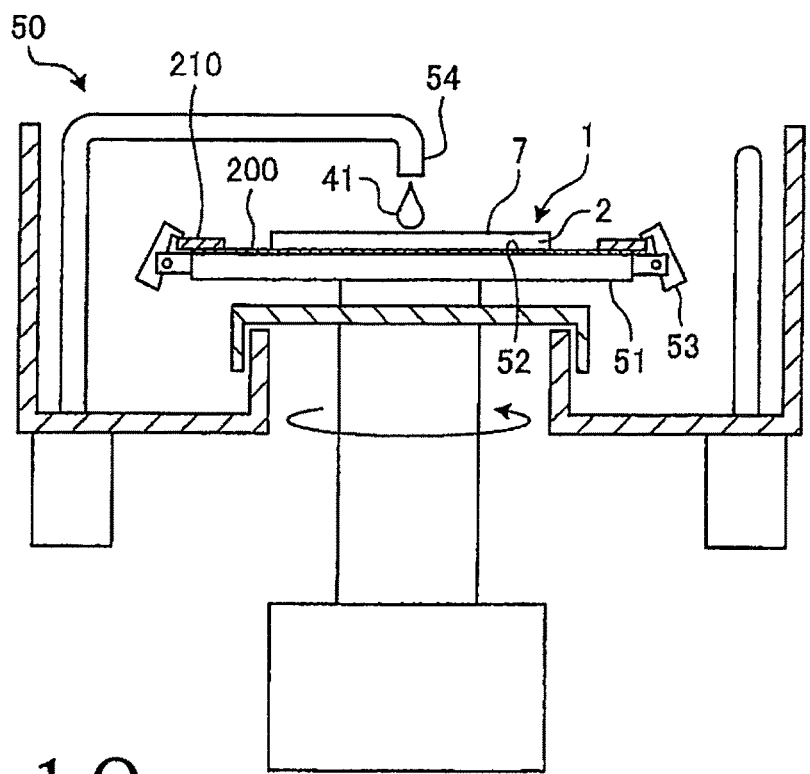
FIG. 9 is a sectional side view schematically depicting a condition that a solution of water-soluble resin is supplied to the back side of the wafer in a mask forming step included in the wafer processing method depicted in FIG. 3.
Figure 11:
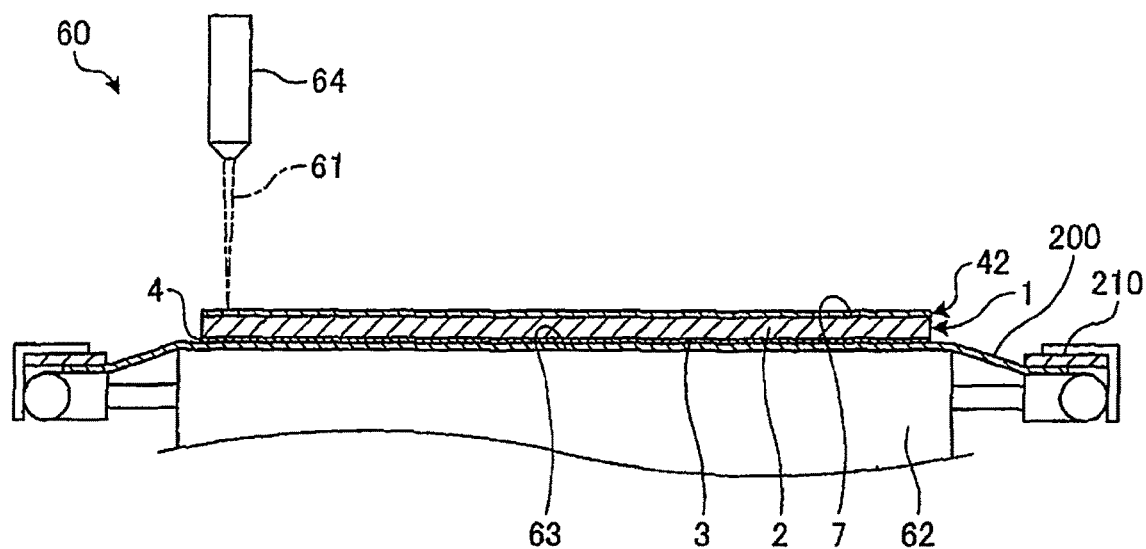
FIG. 11 is a sectional view schematically depicting a condition that a laser beam is applied to the water-soluble resin on the back side of the wafer in the mask forming step.
Figure 12:
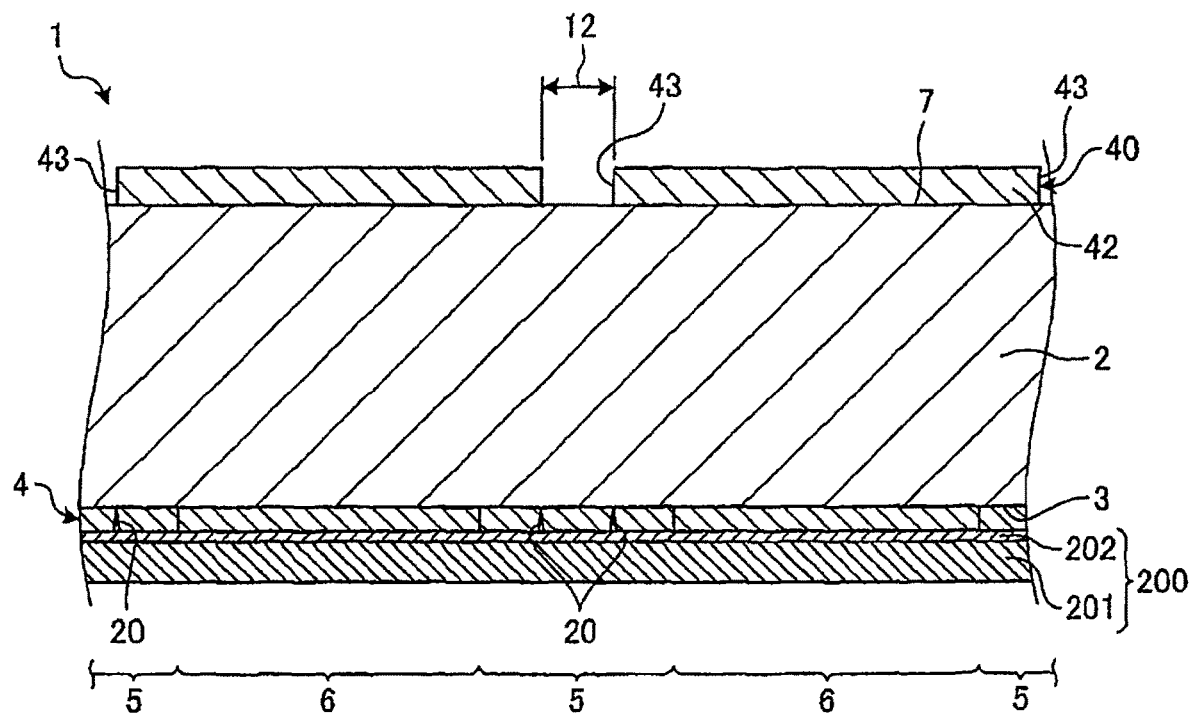
FIG. 12 is a sectional view of an essential part of the wafer in a condition where the mask forming step is finished.

FIG. 9 is a sectional side view schematically depicting a condition that a solution of water-soluble resin is supplied to the back side 7 of the wafer 1 in the mask forming step ST3 of the wafer processing method depicted in FIG. 3. FIG. 10 is a sectional view of an essential part of the wafer 1 in the condition where the water-soluble resin has been applied to the back side 7 of the wafer 1 in the mask forming step ST3 of the wafer processing method depicted in FIG. 3. FIG. 11 is a sectional view schematically depicting a condition that a laser beam is applied to the water-soluble resin on the back side 7 of the wafer 1 in the mask forming step ST3 of the wafer processing method depicted in FIG. 3. FIG. 12 is a sectional view of an essential part of the wafer 1 in the condition where the mask forming step ST3 of the wafer processing method depicted in FIG. 3 is finished.

The mask forming step ST3 is a step of forming a mask 40 (see FIG. 12) on the back side 7 of the wafer 1 so as to form the etched groove 10 along each street 5 through the thickness of the substrate 2 from the back side 7 of the wafer 1 in the plasma etching step ST4. As depicted in FIG. 9, the mask forming step ST3 is performed by using a coating and cleaning apparatus 50. The coating and cleaning apparatus 50 includes a spinner table 51 having a holding surface 52 and a water-soluble resin solution nozzle 54 for supplying a water-soluble resin solution 41. A plurality of clamps 53 are provided on the outer circumference of the spinner table 51. In the mask forming step ST3, the front side 3 of the wafer 1 is held under suction through the adhesive tape 200 on the holding surface 52 of the spinner table 51. Further, the ring frame 210 is fixed by the plural clamps 53 to the spinner table 51.

Thereafter, the spinner table 51 is rotated about its vertical axis and the water-soluble resin solution 41 is supplied from the water-soluble resin solution nozzle 54 to the back side 7 of the substrate 2 of the wafer 1. The water-soluble resin solution 41 is a solution of water-soluble resin such as polyvinyl alcohol (PVA) or polyvinyl pyrrolidone (PVP).

After supplying the water-soluble resin solution 41 to the back side 7 of the substrate 2 of the wafer 1 to coat the back side 7 with the water-soluble resin solution 41, the solution 41 is dried or heated to be cured, thereby forming a resin layer 42 on the back side 7 of the wafer 1 as depicted in FIG. 10. In other words, the resin layer 42 is formed by curing the water-soluble resin solution 41 supplied to the whole of the back side 7 of the substrate 2 of the wafer 1. After coating the whole of the back side 7 of the wafer 1 with the resin layer 42, the suction holding of the wafer 1 on the spinner table 51 is canceled and the clamping of the ring frame 210 by the clamps 53 is also canceled.

Thereafter, the resin layer 42 is grooved by using a laser processing apparatus 60 depicted in FIG. 11. The laser processing apparatus 60 includes a chuck table 62 having a holding surface 63 and a laser beam applying unit 64 for applying a laser beam 61. In the mask forming step ST3, the front side 3 of the substrate 2 of the wafer 1 is held under suction through the adhesive tape 200 on the holding surface 63 of the chuck table 62. Thereafter, an infrared camera (not depicted) is used to image the wafer 1 held on the chuck table 62 and thereby detect the streets 5. According to an image obtained by the infrared camera, alignment is performed to adjust the positional relation between the wafer 1 and the laser beam applying unit 64.

Thereafter, the chuck table 62 and the laser beam applying unit 64 are relatively moved in a horizontal direction along each street 5. At the same time, the laser beam 61 having an absorption wavelength to the resin layer 42 is applied from the laser beam applying unit 64 to the resin layer 42 at the position corresponding to the center of each street 5 in the lateral direction thereof. This operation is similarly performed along all of the streets 5 to form a plurality of grooves 43 along all of the streets 5 so that each groove 43 has a depth equal to the thickness of the resin layer 42. In other words, each groove 43 is formed by performing ablation of the resin layer 42 along each street 5.

As depicted in FIG. 12, the resin layer 42 is removed at the position corresponding to the center of each street 5 in the lateral direction thereof by applying the laser beam 61, thereby forming the groove 43 along each street 5 so that the back side 7 of the substrate 2 is exposed to the groove 43 at the position corresponding to the center of each street 5 in the lateral direction thereof. Thus, the resin layer 42 in which the plural grooves 43 respectively corresponding to the plural streets 5 have been formed becomes the mask 40 to be used in the plasma etching step ST4, in which the mask 40 is resistant to plasma. Each groove 43 extends linearly in the longitudinal direction of each street 5 at the position corresponding to the center of each street 5 in the lateral direction thereof.

In FIG. 12, reference numeral 12 denotes the width of each groove 43. The width 12 of each groove 43 is equal to the width of each etched groove 10 on the back side 7 of the substrate 2. This width 12 is larger than the distance 21 mentioned above but smaller than the distance 22 mentioned above. After finishing the mask forming step ST3 to form the mask 40, the wafer processing method depicted in FIG. 3 proceeds to the plasma etching step ST4. As described above, each groove 43 is formed in the mask forming step ST3 so that the difference between the width 11 of the etched groove 10 on the front side 3 of the substrate 2 and the distance 22 between the outer edges of the two device layer dividing grooves 20 on the lower surface of the device layer 4 is greater than 0 μm but not greater than 30 μm.

(Plasma Etching Step)

Figure 13:
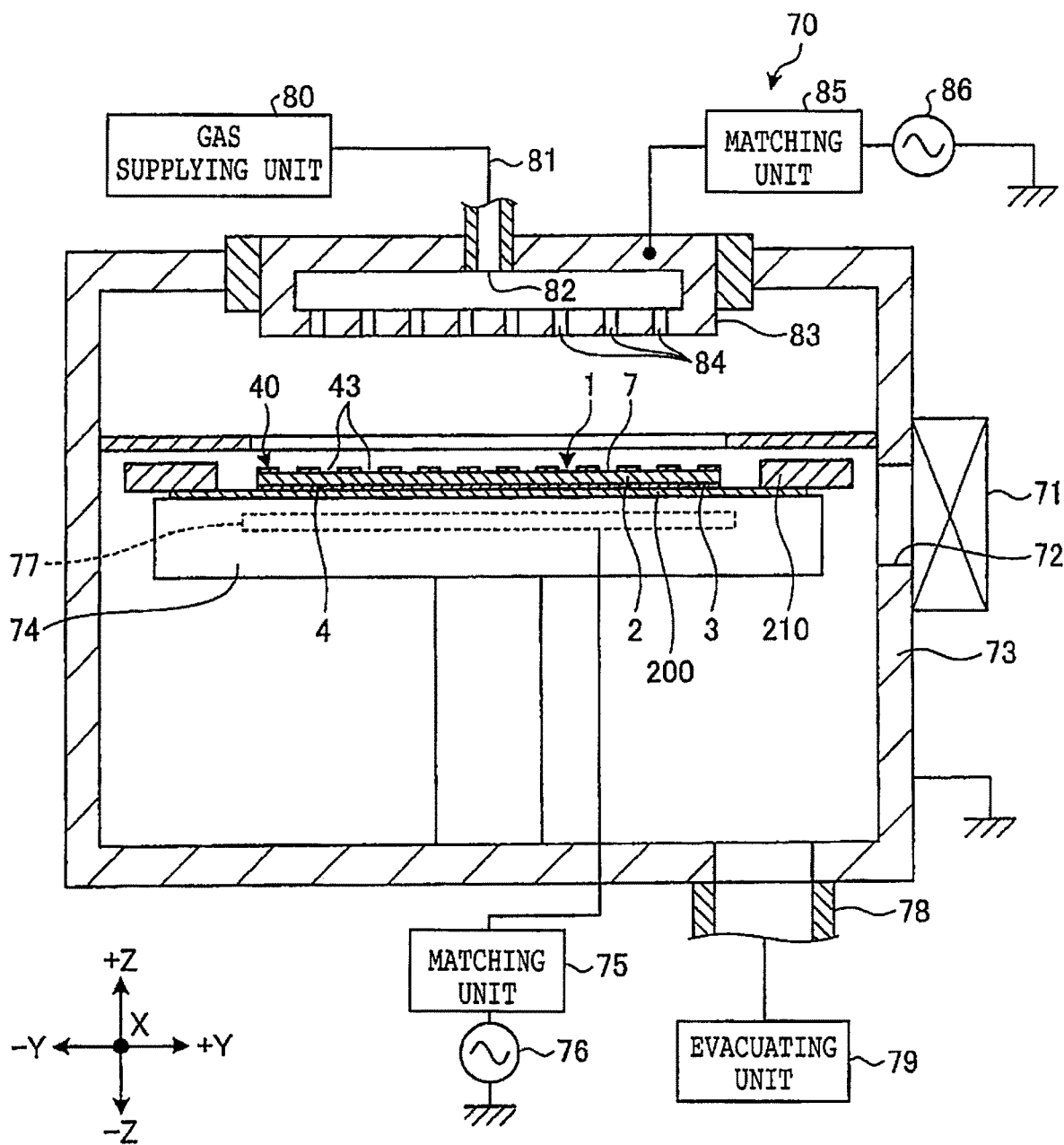
FIG. 13 is a sectional view depicting a configuration of an etching apparatus to be used in a plasma etching step included in the wafer processing method depicted in FIG. 3.
Figure 14:
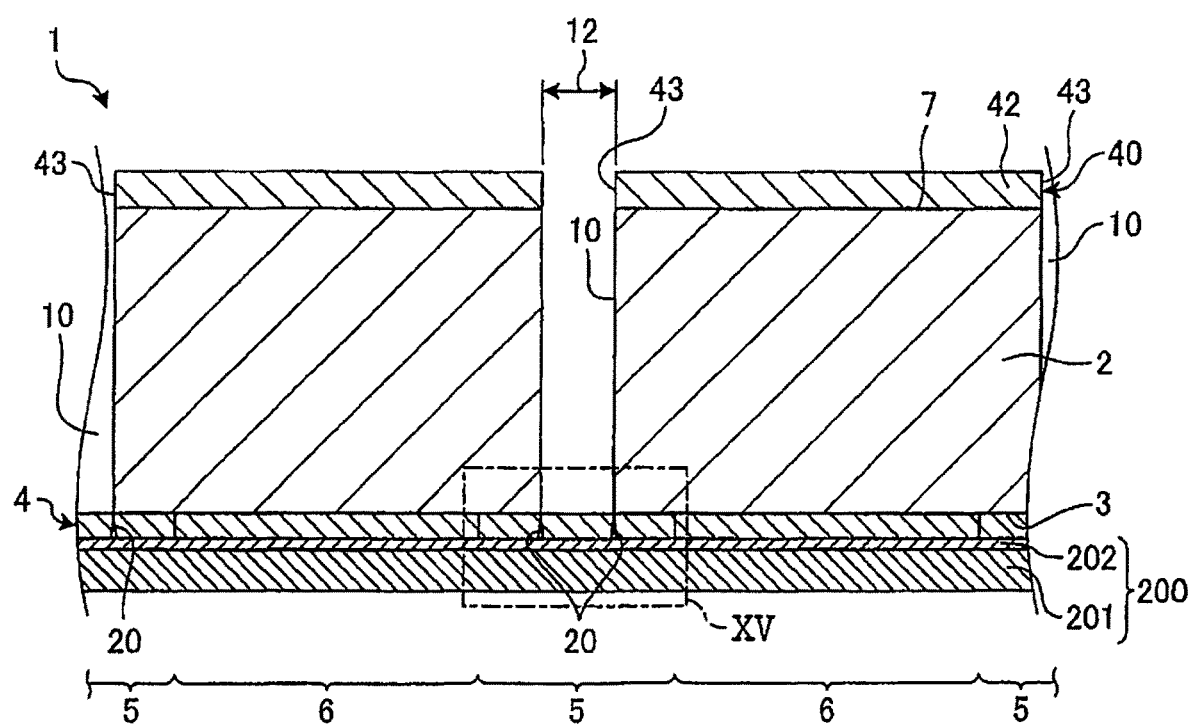
FIG. 14 is a schematic sectional view of an essential part of the wafer in a condition where the plasma etching step is finished.
Figure 15:
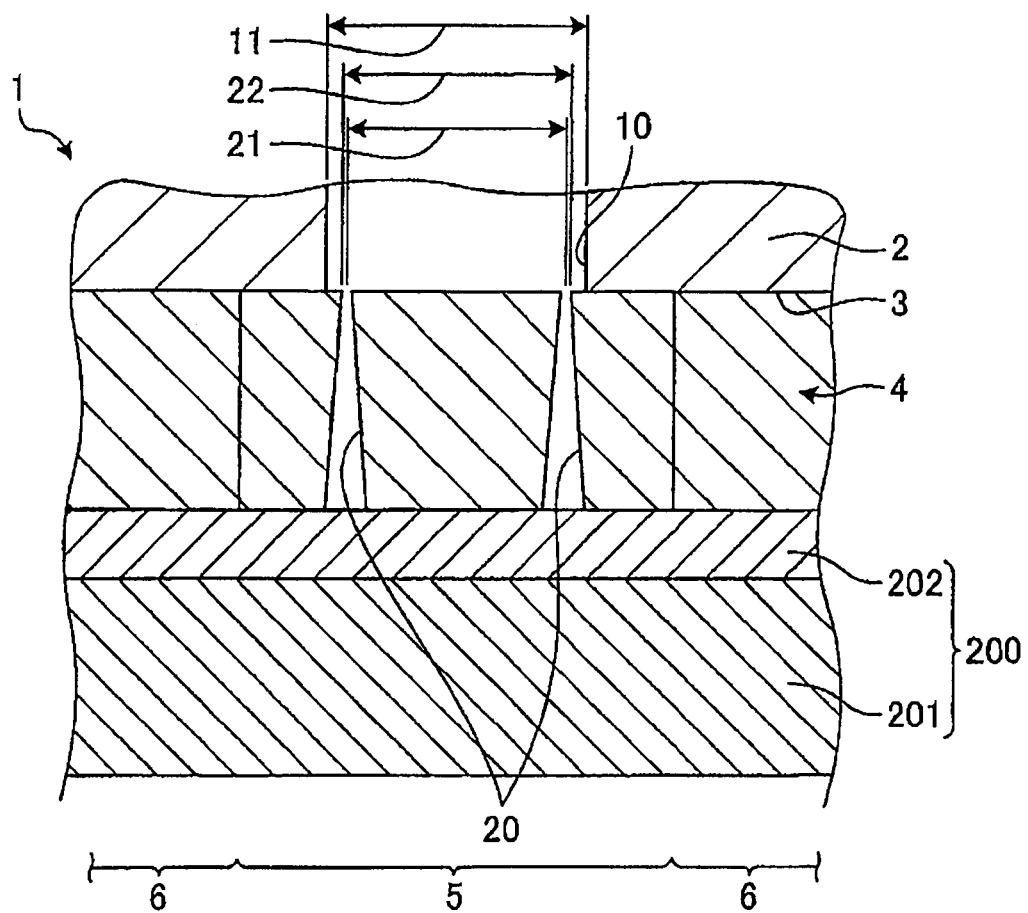
FIG. 15 is an enlarged view of a box part XV in FIG. 14.

FIG. 13 is a sectional view depicting the configuration of an etching apparatus 70 to be used in the plasma etching step ST4 of the wafer processing method depicted in FIG. 3. FIG. 14 is a schematic sectional view of an essential part of the wafer 1 in the condition where the plasma etching step ST4 of the wafer processing method depicted in FIG. 3 is finished. FIG. 15 is an enlarged view of a box part XV in FIG. 14.

The plasma etching step ST4 is a step of performing plasma etching from the back side 7 of the substrate 2 of the wafer 1 through the mask 40 to the substrate 2 after performing the mask forming step ST3, thereby forming a plurality of etched grooves 10 in the substrate 2 respectively along the plural streets 5 so that each etched groove 10 has a depth equal to the thickness of the substrate 2. The plasma etching step ST4 is performed by using the etching apparatus 70 depicted in FIG. 13. The etching apparatus 70 includes a chamber 73 having a load/unload opening 72. The load/unload opening 72 is closed by a gate valve 71. In operation, the gate valve 71 is opened to load the wafer 1 supported through the adhesive tape 200 to the ring frame 210 from the load/unload opening 72. The front side 3 of the wafer 1 is electrostatically held through the adhesive tape 200 on an electrostatic chuck (ESC) 74. In electrostatically holding the wafer 1 on the electrostatic chuck 74, electric power is supplied from a bias radio frequency (RF) power source 76 through a matching unit 75 to an electrode 77 provided in the electrostatic chuck 74.

Thereafter, an evacuating unit 79 is operated to evacuate the inside space of the chamber 73 through an evacuation pipe 78, thereby reducing the pressure inside the chamber 73 to a predetermined pressure. Further, the temperature of the electrostatic chuck 74 is adjusted to a predetermined temperature at which no gas is generated from the adhesive tape 200. In this condition, an etching step and a film deposition step are alternately repeated. The etching step is a step of etching the substrate 2 exposed to the bottom of each groove 43 of the mask 40, thereby forming each etched groove 10 on the back side 7 of the substrate 2 and advancing each etched groove 10 toward the front side 3 of the substrate 2. The film deposition step is a step of depositing a film on an inside surface of each etched groove 10 after performing the etching step. In the etching step after performing the film deposition step, the film deposited on the bottom of each etched groove 10 is removed and the bottom of each etched groove 10 is next etched. In this manner, the plasma etching step ST4 uses what is generally called a Bosch process to perform plasma etching to the wafer 1. In other words, in the plasma etching step ST4, the wafer 1 is divided into individual device chips respectively including the devices 6 by performing what is generally called plasma dicing.

In the etching step, $SF_6$ gas as etching gas is supplied from a gas supplying unit 80 through a gas pipe 81 and a gas inlet opening 82 to a gas discharge head 83. The $SF_6$ gas thus supplied is discharged from a plurality of gas discharge openings 84 toward the wafer 1 held on the electrostatic chuck 74. In the condition where the $SF_6$ gas for generating plasma is supplied to the gas discharge head 83, RF power for generating a plasma and maintaining it is applied from an RF power source 86 through a matching unit 85 to the gas discharge head 83, and RF power for drawing ions is applied from the RF power source 86 to the electrostatic chuck 74. Accordingly, isotropic plasma dissociated from the $SF_6$ gas is generated in the space between the electrostatic chuck 74 and the gas discharge head 83. This plasma is drawn through each groove 43 of the mask 40 into the substrate 2 of the wafer 1 to thereby etch the bottom of each groove 43 and the bottom of each etched groove 10. Further, each etched groove 10 is advanced toward the front side 3 of the substrate 2 of the wafer 1.

In the film deposition step, $C_4F_8$ gas as deposition gas is supplied from the gas supplying unit 80 to the gas discharge head 83 and discharged from the gas discharge openings 84 toward the wafer 1 held on the electrostatic chuck 74. In the condition where the $C_4F_8$ gas for generating plasma is supplied to the gas discharge head 83, RF power for generating plasma and maintaining it is applied from the RF power source 86 to the gas discharge head 83, and RF power for drawing ions is applied from the RF power source 86 to the electrostatic chuck 74. Accordingly, plasma dissociated from the $C_4F_8$ gas is generated in the space between the electrostatic chuck 74 and the gas discharge head 83. This plasma is drawn into the substrate 2 of the wafer 1 to thereby deposit a film on the inside surface of each etched groove 10.

In the plasma etching step ST4, the number of repetitions of the etching step and the film deposition step is previously set according to the thickness of the substrate 2 of the wafer 1. By performing the etching step and the film deposition film by the preset number of repetitions, the wafer 1 is etched so that each etched groove 10 reaches the front side 3 of the substrate 2 as depicted in FIGS. 14 and 15. Further, since the two device layer dividing grooves 20 are formed to divide the device layer 4 along each street 5 before performing the plasma etching step ST4, the wafer 1 is divided into individual device chips respectively including the devices 6.

In general, steps are formed on the inside surface of each etched groove 10 according to the number of repetitions of the etching step and the film deposition step. However, these steps are not depicted in FIG. 14 and other drawings. Further, with the advance of each etched groove 10, the width of each etched groove 10 is gradually increased or decreased (in the first preferred embodiment, the width of each etched groove 10 is gradually increased). However, the width of each etched groove 10 is depicted to be constant in FIG. 14 and the other drawings.

As depicted in FIG. 15, the width 11 of each etched groove 10 on the front side 3 of the substrate 2 is larger than the distance 22 on the lower surface (the back side) of the device layer 4 in the condition where the plasma etching step ST4 is finished. Further, the difference between the width 11 and the distance 22 is greater than 0 μm but not greater than 30 μm.

While the etching apparatus 70 depicted in FIG. 13 is used in the plasma etching step ST4 in the first preferred embodiment, the etching apparatus usable in the present invention is not limited to the etching apparatus 70 depicted in FIG. 13. After finishing the plasma etching step ST4, the wafer processing method depicted in FIG. 3 proceeds to the mask removing step ST5.

(Mask Removing Step)

Figure 16:
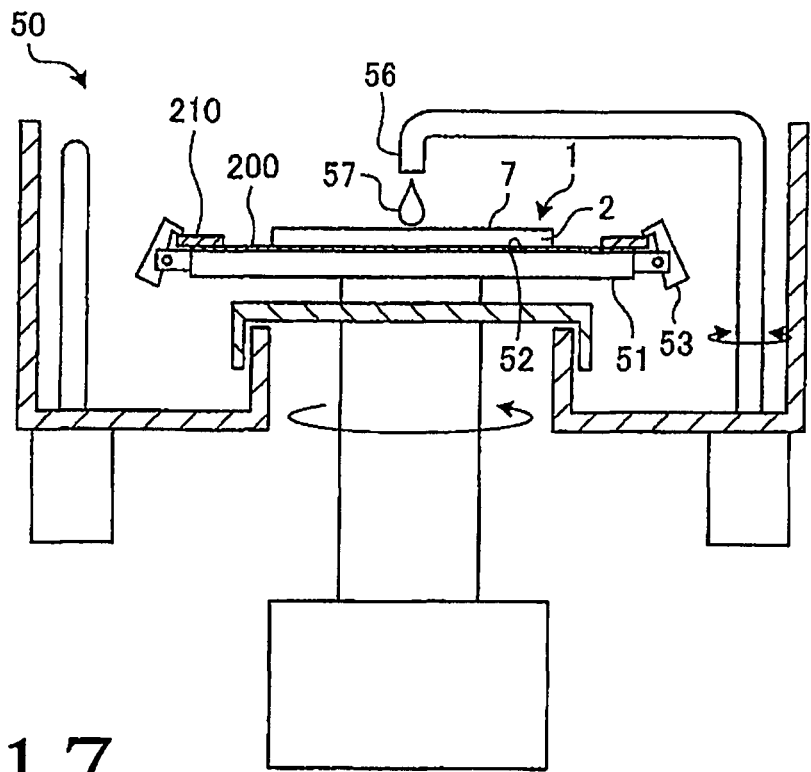
FIG. 16 is a schematic sectional side view depicting a mask removing step included in the wafer processing method depicted in FIG. 3.

FIG. 16 is a schematic sectional side view depicting the mask removing step ST5 of the wafer processing method depicted in FIG. 3. The mask removing step ST5 is a step of removing the mask 40 after performing the plasma etching step ST4.

As depicted in FIG. 16, the mask removing step ST5 is performed by using the coating and cleaning apparatus 50 used in the mask forming step ST3. The coating and cleaning apparatus 50 further includes a cleaning water nozzle 56 for supplying cleaning water 57 such as pure water.

In the mask removing step ST5, the wafer 1 is held on the spinner table 51 in a manner similar to that in the mask forming step ST3. Thereafter, the spinner table 51 is rotated about its vertical axis, and the cleaning water 57 is supplied from the cleaning water nozzle 56 to the back side 7 of the substrate 2 of the wafer 1.

The cleaning water 57 supplied to the back side 7 of the substrate 2 flows toward the outer circumference of the wafer 1 due to a centrifugal force generated by the rotation of the spinner table 51, so that the resin layer 42 forming the mask 40 is removed because the resin layer 42 is formed of water-soluble resin, thus cleaning the back side 7 of the wafer 1. After supplying the cleaning water 57 for a predetermined period of time to clean the back side 7 of the wafer 1 and next drying the wafer 1, the rotation of the spinner table 51 is stopped. Further, the suction holding of the wafer 1 on the spinner table 51 and the clamping of the ring frame 210 by the clamps 53 are also canceled. Thereafter, the wafer processing method depicted in FIG. 3 proceeds to the pickup step ST6.

(Pickup Step)

Figure 17:
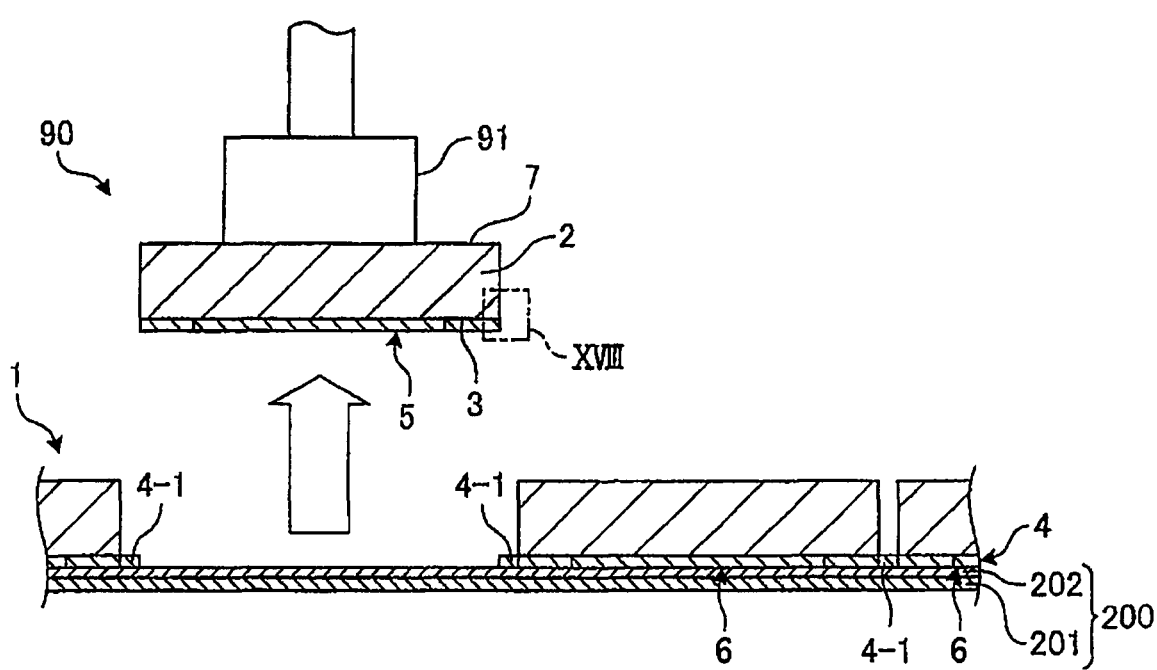
FIG. 17 is a schematic sectional view depicting a pickup step included in the wafer processing method depicted in FIG. 3.
Figure 18:
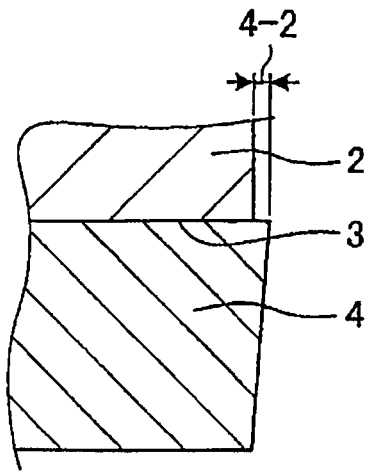
FIG. 18 is an enlarged view of a box part XVIII in FIG. 17.

FIG. 17 is a schematic sectional view depicting the pickup step ST6 of the wafer processing method depicted in FIG. 3. FIG. 18 is an enlarged view of a box part XVIII in FIG. 17. The pickup step ST6 is a step of separating each device chip including the device 6 from the adhesive tape 200.

As depicted in FIG. 17, the pickup step ST6 is performed by using a pickup apparatus 90 having a pickup member 91. In the pickup step ST6, each of the individual device chips respectively including the devices 6 is held by the pickup member 91 of the pickup apparatus 90 and then raised to be separated from the adhesive tape 200 as depicted in FIG. 17. Since the individual device chips are held separately by the pickup member 91, a portion 4-1 between the two device layer dividing grooves 20 along each street 5 in the device layer 4 is left on the adhesive tape 200 as depicted in FIG. 17. When all of the individual device chips are separated from the adhesive tape 200, the wafer processing method depicted in FIG. 3 is ended.

As described above, the wafer processing method according to the first preferred embodiment includes the plasma etching step ST4 of performing plasma etching from the back side 7 of the substrate 2 of the wafer 1. Accordingly, there is no possibility for the devices 6 to be exposed in a thin region of the mask 40 during plasma etching, so that damage to the devices 6 can be suppressed.

Further, the wafer processing method according to the first preferred embodiment includes the device layer dividing step ST1 of forming the device layer dividing groove 20 along each street 5 in the device layer 4 before performing the plasma etching step ST4.

Accordingly, by performing the plasma etching step ST4 to perform plasma etching from the back side 7 of the substrate 2 through the thickness of the substrate 2, the wafer 1 can be divided into the individual device chips respectively including the devices 6. In other words, the wafer 1 can be divided into the individual device chips while suppressing damage to the devices 6.

Further, in the condition where the plasma etching step ST4 is finished, the width 11 of each etched groove 10 on the front side 3 of the substrate 2 is larger than the distance 22 on the lower surface of the device layer 4. Accordingly, a thermally affected area generated in the substrate 2 at a position below the device layer dividing groove 20 by the application of the laser beam 31 can be removed by the plasma etching. As a result, as compared with the case where the width 11 of each etched groove 10 on the front side 3 of the substrate 2 is smaller than the distance 22 on the lower surface of the device layer 4, the die strength of each device chip can be improved.

Further, in the device layer dividing step ST1, the two device layer dividing grooves 20 are formed in the device layer 4 at the lateral end portions of each street 5. Accordingly, in the pickup step ST6, the portion 4-1 between the two device layer dividing grooves 20 along each street 5 in the device layer 4 is left on the adhesive tape 200. As a result, time and effort for removing the portion 4-1 can be eliminated.

Further, the difference between the width 11 of each etched groove 10 on the front side 3 of the substrate 2 and the distance 22 on the lower surface of the device layer 4 is greater than 0 µm but not greater than 30 µm. Accordingly, an amount 4-2 of projection of the device layer 4 from the side surface of the substrate 2 of each device chip as depicted in FIG. 18 becomes greater than 0 µm but not greater than 15 µm. As a result, in addition to the effect that the die strength of each device chip can be improved by making the width 11 larger than the distance 22, the projection amount 4-2 can be minimized to thereby suppress chipping of a portion of the device layer 4 projecting from the side surface of the substrate 2, so that defective mounting of each device chip can be suppressed and possible separation of the device layer 4 from the substrate 2 in each device chip can also be suppressed.

Further, in the device layer dividing step ST1, the two device layer dividing grooves 20 are formed in the device layer 4 at the lateral end portions of each street 5. Accordingly, as compared with the case of forming a single device layer dividing groove along each street 5, the power of the laser beam 31 can be reduced. As a result, each device layer dividing groove 20 can be formed in one pass of the laser beam 31, thereby suppressing a reduction in productivity. Furthermore, it is possible to suppress the damage in the thermally affected area generated in the substrate 2 at the position below each device layer dividing groove 20 by the application of the laser beam 31.

Second Preferred Embodiment

Figure 19:
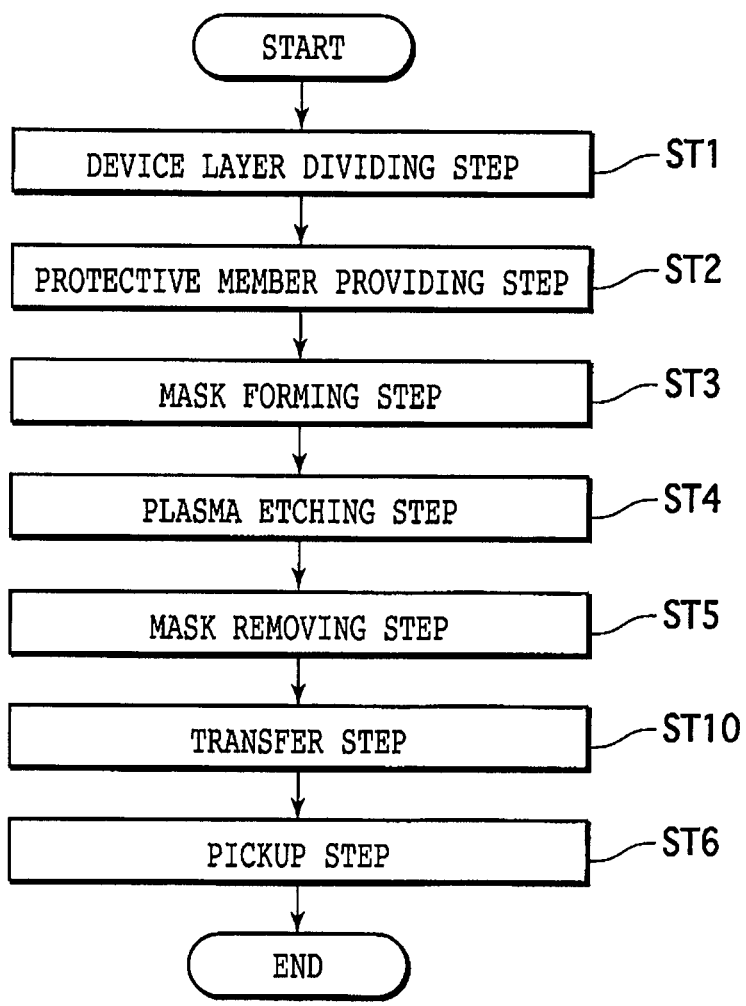
FIG. 19 is a flowchart depicting the flow of a wafer processing method according to a second preferred embodiment of the present invention.
Figure 20:
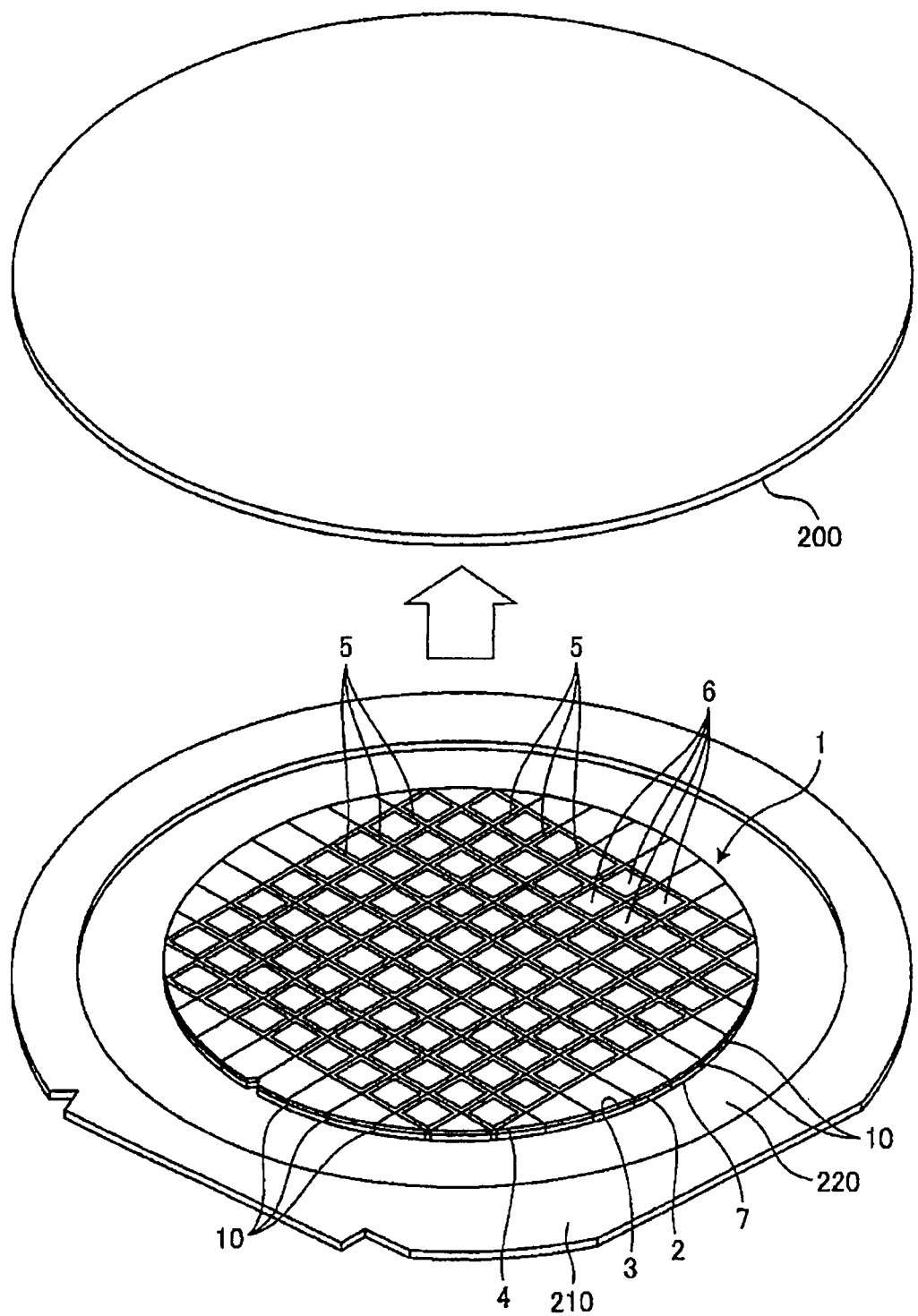
FIG. 20 is a perspective view depicting a transfer step included in the wafer processing method depicted in FIG. 19.
Figure 21:
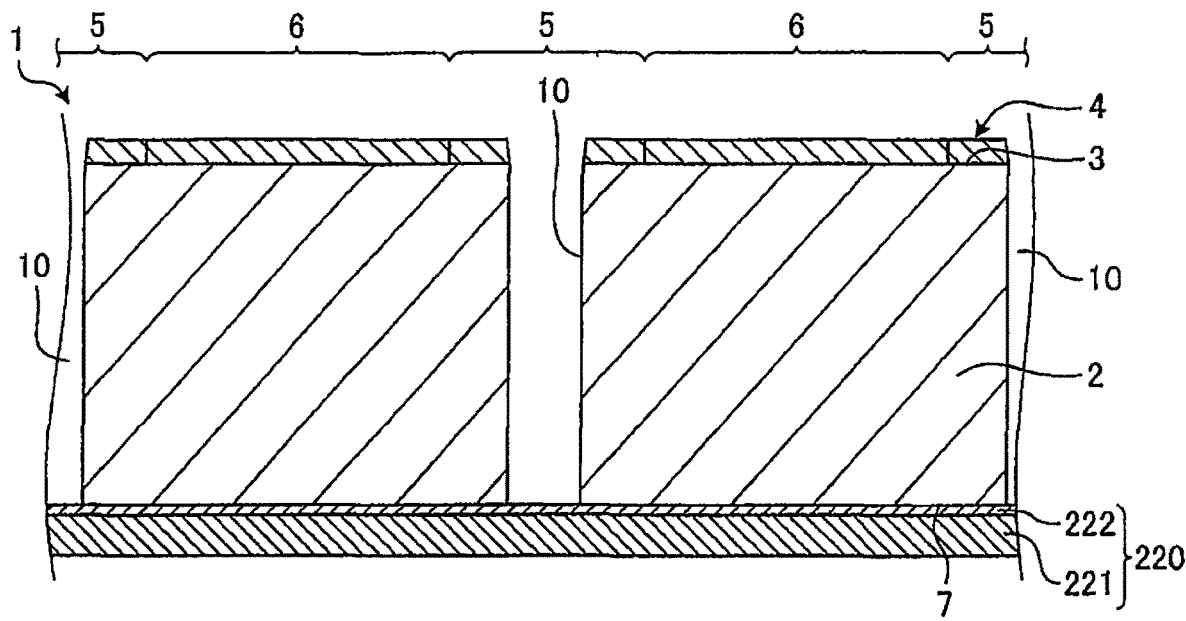
FIG. 21 is a sectional view of an essential part of the wafer, taken along the line XXI-XXI in FIG. 20.
Figure 22:
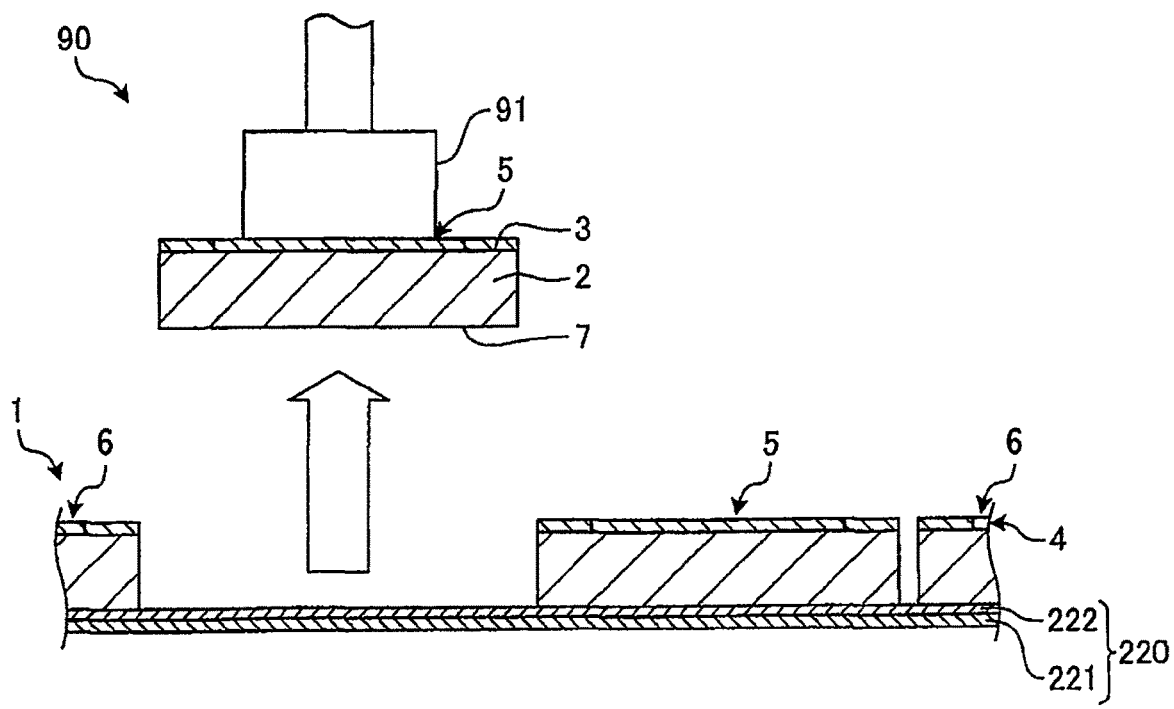
FIG. 22 is a schematic sectional view depicting a pickup step included in the wafer processing method depicted in FIG. 19.

A wafer processing method according to a second preferred embodiment of the present invention will now be described with reference to the drawings. FIG. 19 is a flowchart depicting the flow of the wafer processing method according to the second preferred embodiment. FIG. 20 is a perspective view depicting a transfer step included in the wafer processing method depicted in FIG. 19. FIG. 21 is a sectional view of an essential part of the wafer 1, taken along the line XXI-XXI in FIG. 20. FIG. 22 is a schematic sectional view depicting a pickup step included in the wafer processing method depicted in FIG. 19. In FIGS. 19, 20, 21, and 22, the same parts as those in the first preferred embodiment are denoted by the same reference numerals, and the description thereof will be omitted.

As depicted in FIG. 19, the wafer processing method according to the second preferred embodiment is the same as the first preferred embodiment except a transfer step ST10 is added. The transfer step ST10 is a step of providing an adhesive tape 220, as a support member, on the back side 7 of the wafer 1 and removing the adhesive tape 200 as the protective member from the front side 3 (the device layer 4) of the wafer 1, after performing the plasma etching step ST4 and the mask removing step ST5.

As depicted in FIGS. 20 and 21, the adhesive tape 220 is a circular tape larger in diameter than the wafer 1, and a central portion of the adhesive tape 220 is attached to the back side 7 of the substrate 2 of the wafer 1. A peripheral portion of the adhesive tape 220 is attached to the ring frame 210. Thereafter, the adhesive tape 220 is peeled off from the device layer 4 of the wafer 1 and is also peeled off from the ring frame 210. As depicted in FIG. 21, the adhesive tape 220 is composed of a base layer 221 and an adhesive layer 222 formed on one side of the base layer 221. The base layer 221 is formed of an insulating synthetic resin. In the transfer step ST10, the portion 4-1 between the two device layer dividing grooves 20 along each street 5 in the device layer 4 is left on the adhesive tape 200 and thereby removed from the wafer 1.

While the adhesive tape 220 larger in diameter than the wafer 1 is used as the support member in the second preferred embodiment, the support member usable in the present invention is not limited to the adhesive tape 220 depicted in FIGS. 20 and 21. For example, an adhesive tape having a diameter equal to that of the wafer 1 may be used as the support member without using the ring frame 210, in which this adhesive tape is composed of the base layer 221 and the adhesive tape 222. After finishing the transfer step ST10, the wafer processing method depicted in FIG. 19 proceeds to the pickup step ST6.

In the pickup step ST6 of the wafer processing method depicted in FIG. 19, a pickup apparatus 90 depicted in FIG. 22 is used. The pickup apparatus 90 depicted in FIG. 22 is the same as that depicted in FIG. 17. As depicted in FIG. 22, the device layer 4 of each device chip is held by the pickup member 91 of the pickup apparatus 90 and then raised to be separated from the adhesive tape 220. When all of the individual device chips are separated from the adhesive tape 220, the wafer processing method depicted in FIG. 19 is ended.

The wafer processing method according to the second preferred embodiment also includes the plasma etching step ST4 of performing plasma etching from the back side 7 of the substrate 2 of the wafer 1. Accordingly, damage to the devices 6 can be suppressed. Further, the wafer processing method according to the second preferred embodiment also includes the device layer dividing step ST1 of forming the device layer dividing groove 20 along each street 5 in the device layer 4 before performing the plasma etching step ST4. Accordingly, by performing the plasma etching step ST4, the wafer 1 can be divided into the individual device chips respectively including the devices 6. Thus, as similar to the first preferred embodiment, the wafer processing method according to the second preferred embodiment has the effect that the wafer 1 can be divided into the individual device chips while suppressing damage to the devices 6.

In addition, the wafer processing method according to the second preferred embodiment includes the transfer step ST10, in which the portion 4-1 between the two device layer dividing grooves 20 along each street 5 in the device layer 4 can be removed together with the adhesive tape 200, so that time and effort for removing the portion 4-1 can be eliminated.

[Modification]

Figure 23:
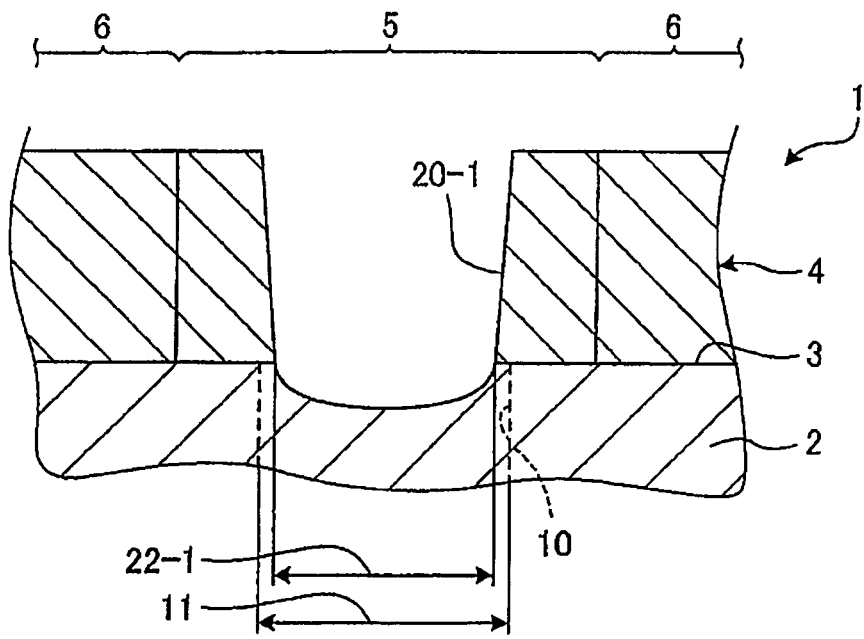
FIG. 23 is a sectional view depicting an essential part of the wafer in a condition where a device layer dividing step included in the wafer processing method according to a modification of the first and second preferred embodiments is finished.

A wafer processing method according to a modification of the first and second preferred embodiments of the present invention will now be described with reference to the drawings. FIG. 23 is a sectional view depicting an essential part of the wafer 1 in the condition where a device layer dividing step ST1 included in the wafer processing method according to this modification is finished. In FIG. 23, the same parts as those in the first and second preferred embodiments are denoted by the same reference numerals, and the description thereof will be omitted.

The wafer processing method according to this modification is the same as that according to the first and second preferred embodiments except the device layer dividing step ST1 is different. In the device layer dividing step ST1 of the wafer processing method according to this modification, the laser beam 31 (see FIG. 4) is applied to the center of each street 5 in the lateral direction thereof, thereby forming a single device layer dividing groove 20-1 along each street 5 at the lateral center thereof as depicted in FIG. 23, in which this single device layer dividing groove 20-1 along each street 5 is a dividing groove for dividing the device layer 4.

In this modification, the width 11 of each etched groove 10 on the front side 3 of the substrate 2 is larger than the width 22-1 of the single device layer dividing groove 20-1 on the lower surface of the device layer 4 as depicted in FIG. 23. Further, in this modification, the focal point of the laser beam 31 is set to form the device layer dividing groove 20-1 along each street 5 so that the difference between the width 11 of each etched groove 10 on the front side 3 of the substrate 2 and the width 22-1 of the device layer dividing groove 20-1 on the lower surface of the device layer 4 is greater than 0 µm but not greater than 30 µm.

The wafer processing method according to this modification also includes the plasma etching step ST4 of performing plasma etching from the back side 7 of the substrate 2 of the wafer 1. Accordingly, damage to the devices 6 can be suppressed. Further, the wafer processing method according to this modification also includes the device layer dividing step ST1 of forming the device layer dividing groove 20-1 along each street 5 in the device layer 4 before performing the plasma etching step ST4. Accordingly, by performing the plasma etching step ST4, the wafer 1 can be divided into the individual device chips respectively including the devices 6. Thus, as similar to the first and second preferred embodiments, the wafer processing method according to this modification has the effect that the wafer 1 can be divided into the individual device chips while suppressing damage to the devices 6.

Figure 24:
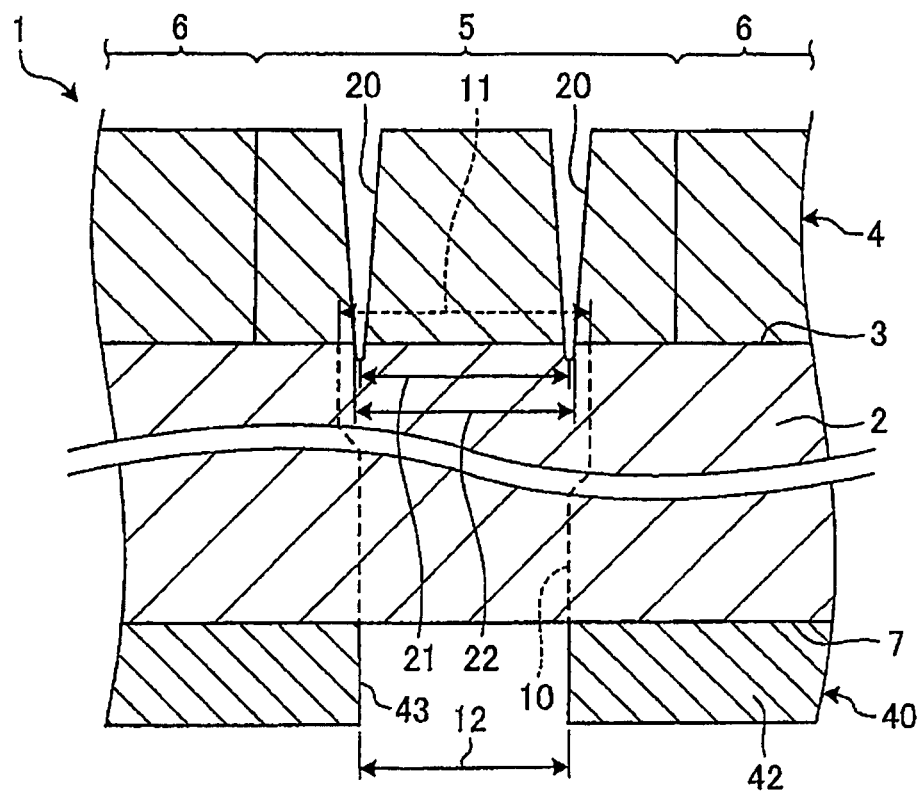
FIG. 24 is a sectional view of an essential part of the wafer in the present invention in the condition where the mask forming step is finished.
Figure 25:
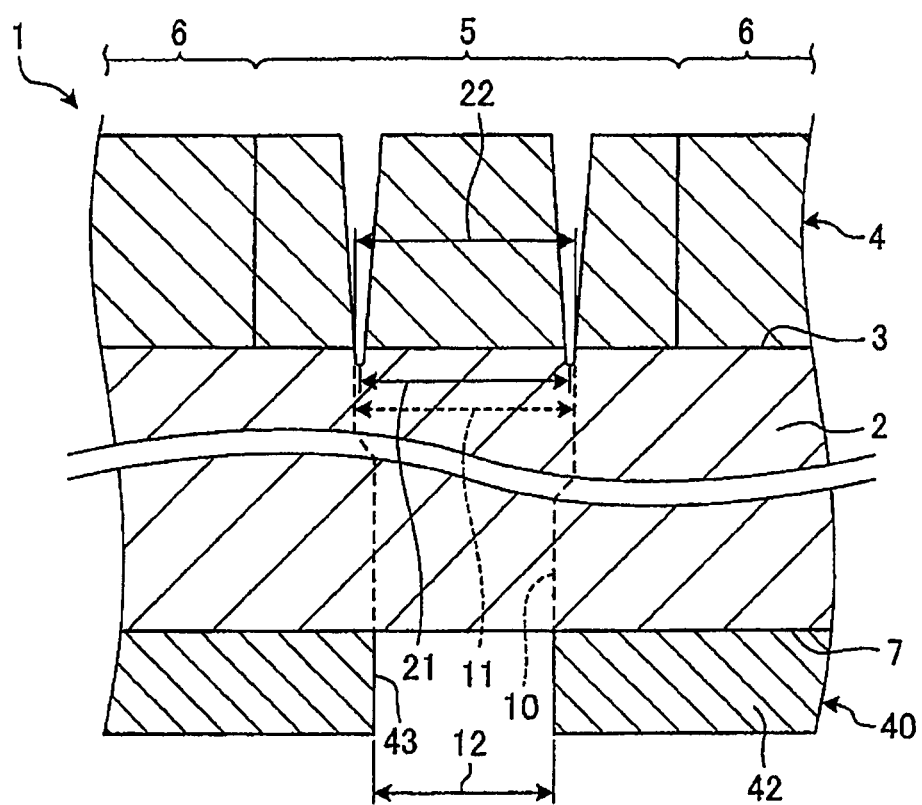
FIG. 25 is a view similar to FIG. 24, depicting a comparison.

The present inventors confirmed the effect of the wafer processing method according to the first preferred embodiment. FIG. 24 depicts the present invention, and FIG. 25 depicts a comparison. The wafer 1 depicted in FIG. 24 and the wafer 1 depicted in FIG. 25 were divided by the wafer processing method according to the first preferred embodiment to obtain the individual device chips respectively including the devices 6. Then, the die strength of each device 6 was measured. FIG. 24 is a sectional view of an essential part of the wafer 1 in the present invention in the condition where the mask forming step is finished. FIG. 25 is a sectional view of an essential part of the wafer 1 in the comparison in the condition where the mask forming step is finished. In FIGS. 24 and 25, the same parts as those in the first preferred embodiment are denoted by the same reference numerals, and the description thereof will be omitted.

As depicted in FIG. 24, the wafer 1 in the present invention has the following configuration. The width of each groove 43 of the mask 40, i.e., the width 12 of each etched groove 10 on the back side 7 of the substrate 2, is larger than the distance 21 but smaller than the distance 22. Further, the width 11 of each etched groove 10 on the front side 3 of the substrate 2 is larger than the distance 22. More specifically, the width 12 of each etched groove 10 on the back side 7 of the substrate 2 was set to 33 µm, the distance 21 was set to 30 µm, the distance 22 was set to 42 µm, and the width 11 of each etched groove 10 on the front side 3 of the substrate 2 was set to 46 µm.

On the other hand, as depicted in FIG. 25, the wafer 1 in the comparison has the following configuration. The width of each groove 43 of the mask 40, i.e., the width 12 of each etched groove 10 on the back side 7 of the substrate 2, is smaller than both the distance 21 and the distance 22. Further, the width 11 of each etched groove 10 on the front side 3 of the substrate 2 is larger than the distance 21 but smaller than the distance 22. More specifically, the width 12 of each etched groove 10 on the back side 7 of the substrate 2 was set to 30 µm, the distance 21 was set to 40 µm, the distance 22 was set to 52 µm, and the width 11 of each etched groove 10 on the front side 3 of the substrate 2 was set to 43 µm.

Both in the present invention and in the comparison, the width of each etched groove 10 in the plasma etching step ST4 was gradually increased with the advance of etching (with an increase in depth of each etched groove 10). Both in the present invention and in the comparison, the die strength of each device chip was measured and the average of the die strengths of the plural device chips was determined. As the result, the average of the die strengths of the plural device chips in the comparison was 470 MPa, whereas the average of the die strengths of the plural device chips in the present invention was 530 MPa. Accordingly, it became apparent that the die strength of each device chip can be improved by setting the width 12 of each etched groove 10 on the back side 7 of the substrate 2 larger than the distance 21 but smaller than the distance 22 and further setting the width 11 of each etched groove 10 on the front side 3 of the substrate 2 larger than the distance 22.

Further, the present inventors confirmed the effect of the wafer processing method according to the first preferred embodiment by changing the projection amount 4-2 mentioned above. The result is depicted in Table 1. In Table 1, "Comparison #1" is the case where the projection amount 4-2 was set to 0 µm, "Invention #1" is the case where the projection amount 4-2 was set to 1 µm, "Invention #2" is the case where the projection amount 4-2 was set to 15 µm, and "Comparison #2" is the case where the projection amount 4-2 was set to 17 µm. In Table 1, the case where the die strength was equal to or greater than a predetermined value is indicated by a circle, whereas the case where the die strength was less than the predetermined value is indicated by a cross. Further, in Table 1, the case where defective mounting due to the chipping or separation of each device chip or the separation of the device layer 4 was not observed is indicated by a circle, whereas the case where such defective mounting or the separation of the device layer 4 was observed is indicated by a cross.

TABLE 1

|  | Die strength | Defective mounting or separation of device layer |
|---|---|---|
| Comparison #1 | x | o |
| Invention #1 | o | o |
| Invention #2 | o | o |
| Comparison #2 | o | x |

According to Table 1, the die strength in "Comparison #1" is not acceptable as indicated by a cross, whereas the die strength in "Invention #1" and the die strength in "Invention #2" are both acceptable as indicated by circles. Accordingly, it became apparent that the die strength of each device chip can be improved by setting the width 11 of each etched groove 10 on the front side 3 of the substrate 2 larger than the distance 22 and setting the difference between this width 11 and the distance 22 to a value greater than 0 µm but not greater than 30 µm.

Further, according to Table 1, defective mounting or the separation of the device layer was observed in "Comparison #2," whereas defective mounting or the separation of the device layer was not observed both in "Invention #1" and in "Invention #2." Accordingly, it became apparent that the defective mounting of each device chip and the separation of the device layer 4 can be suppressed by setting the width 11 of each etched groove 10 on the front side 3 of the substrate 2 larger than the distance 22 and setting the difference between this width 11 and the distance 22 to a value greater than 0 μm but not greater than 30 μm.

The present invention is not limited to the above preferred embodiments and various modifications may be made without departing from the scope of the present invention. For example, while the mask 40 is formed from the resin layer 42 of water-soluble resin in the first and second preferred embodiments, the mask 40 may be formed from a die attach film (DAF) or back protective sheet (protective sheet for the back side of a flip chip, this protective sheet being left on the back side 7 of each device chip obtained by dividing the wafer 1). In this case, the DAF or the back protective sheet is first attached to the back side 7 of the wafer 1 in the condition where the protective member providing step ST2 is finished. Thereafter, a laser beam is applied to the DAF or the back protective sheet along each street 5 from the back side 7 of the wafer 1, thereby performing ablation to form each groove 43 and thereby form the mask 40. As another modification, ultraviolet (UV) curing resin curable by applying ultraviolet light may be applied to the back side 7 of the wafer 1 in the condition where the protective member providing step ST2 is finished. Thereafter, nano-imprint may be performed to the UV curing resin applied, thereby forming each groove 43 to form the mask 40.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A wafer processing method for processing a wafer having a substrate and a device layer formed on a front side of the substrate, the device layer being partitioned by a plurality of crossing streets to thereby define a plurality of separate regions where a plurality of devices are respectively formed, the wafer processing method comprising:

a mask forming step of forming a mask on a back side of the substrate, so as to form an etched groove along each street through a thickness of the substrate from the back side of the substrate to the front side of the substrate;

a plasma etching step of performing plasma etching from a back side of the wafer through the mask to the substrate after performing the mask forming step, thereby forming the etched groove in the substrate along each street so that the etched groove has a depth equal to the thickness of the substrate; and a device layer dividing step of applying a laser beam to the device layer along each street from a front side of the wafer before performing the plasma etching step and the mask forming step, thereby forming a device layer dividing groove corresponding to the etched groove along each street and extending through a thickness of the dividing step from the front side of the water to the front side of the substrate, wherein a width of the etched groove at the front side of the substrate is larger than a width of the device layer dividing groove at the front side of the substrate.

2. The wafer processing method according to claim 1, wherein the device layer dividing groove comprises two dividing grooves extending along each street so as to be formed at opposite ends along a width of the etched groove on the front side of the substrate.

3. The wafer processing method according to claim 2, further comprising:

a protective member providing step of providing a protective member on the front side of the wafer so as to cover the device layer after performing the device layer dividing step; and a transfer step of providing a support member on the back side of the wafer and removing the protective member from the front side of the wafer, after performing the plasma etching step.

\* \* \* \* \*

UNITED STATES PATENT AND TRADEMARK OFFICE
CERTIFICATE OF CORRECTION

PATENT NO. : 10,991,623 B2  
APPLICATION NO. : 16/709452  
DATED : April 27, 2021  
INVENTOR(S) : Wakahara et al.

Page 1 of 1

It is certified that error appears in the above-identified patent and that said Letters Patent is hereby corrected as shown below:

In the Claims

In Column 16, Line 17, Claim 1: delete "water" and insert --wafer-- therefore.

Signed and Sealed this  
Fourteenth Day of September, 2021

Drew Hirshfeld  
*Performing the Functions and Duties of the*  
*Under Secretary of Commerce for Intellectual Property and*  
*Director of the United States Patent and Trademark Office*